US012787888B2

(12) United States Patent
Chen et al.

(10) Patent No.: US 12,787,888 B2
(45) Date of Patent: Nov. 3, 2026

(54) STRUCTURE AND FORMATION METHOD OF PACKAGE WITH INTERPOSER CHIP

(71) Applicant: Taiwan Semiconductor Manufacturing Co., Ltd., Hsinchu (TW)

(72) Inventors: Po-Yu Chen, Baoshan Township (TW); Yu Hsiang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 318 days.

(21) Appl. No.: 18/645,657

(22) Filed: Apr. 25, 2024

(65) Prior Publication Data

US 2025/0210610 A1 Jun. 26, 2025

Related U.S. Application Data

(60) Provisional application No. 63/613,161, filed on Dec. 21, 2023.

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 72/072* (2026.01); *H10W 72/07254* (2026.01); *H10W 72/073* (2026.01); *H10W 72/247* (2026.01); *H10W 72/252* (2026.01); *H10W 72/325* (2026.01); *H10W 72/352* (2026.01); *H10W 72/353* (2026.01); *H10W 72/354* (2026.01); *H10W 72/877* (2026.01); *H10W 72/941* (2026.01); *H10W 80/327* (2026.01); *H10W 90/722* (2026.01); *H10W 90/724* (2026.01); *H10W 90/736* (2026.01); *H10W 90/792* (2026.01)

(58) Field of Classification Search
CPC . H10W 90/00; H10W 90/792; H10W 90/736; H10W 80/00; H10W 72/072; H10W 72/073
See application file for complete search history.

(56) References Cited

U.S. PATENT DOCUMENTS

2022/0122926 A1* 4/2022 Pei .......................... H10P 72/74
2023/0005814 A1 1/2023 Chung et al.
(Continued)

FOREIGN PATENT DOCUMENTS

TW 202306063 A 2/2023
TW 202336981 A 9/2023
(Continued)

*Primary Examiner* — Mohsen Ahmadi
(74) *Attorney, Agent, or Firm* — Slater Matsil, LLP

(57) ABSTRACT

A package structure and a method for forming a package structure are provided. The package structure includes a chip-containing structure bonded to a redistribution structure through multiple first solder bumps. The package structure also includes a memory-containing structure bonded to an interposer chip. The interposer chip is bonded to the redistribution structure through multiple second solder bumps. The package structure further includes a substrate, and the redistribution structure is over the substrate.

17 Claims, 23 Drawing Sheets

(51) Int. Cl.

| | |
|---|---|
| ***H10W 72/00*** | (2026.01) |
| ***H10W 72/90*** | (2026.01) |
| ***H10W 80/00*** | (2026.01) |
| *H10W 72/20* | (2026.01) |
| *H10W 72/30* | (2026.01) |

(56) References Cited

U.S. PATENT DOCUMENTS

| | | | | |
|---|---|---|---|---|
| 2023/0021005 | A1* | 1/2023 | Chiou | H10W 40/037 |
| 2023/0154825 | A1 | 5/2023 | Tong | |
| 2023/0178469 | A1* | 6/2023 | Nam | H10W 42/121 257/690 |
| 2023/0351577 | A1* | 11/2023 | Chen | G01N 1/44 |
| 2023/0378132 | A1* | 11/2023 | Shen | H10W 20/0698 |
| 2023/0387101 | A1* | 11/2023 | Tsao | H10P 72/74 |
| 2023/0402339 | A1 | 12/2023 | Yeh et al. | |
| 2023/0402345 | A1* | 12/2023 | Yu | H10W 40/037 |
| 2023/0402438 | A1* | 12/2023 | Liu | H10W 20/20 |

FOREIGN PATENT DOCUMENTS

| | | | |
|---|---|---|---|
| TW | 202343597 | A | 11/2023 |
| TW | 202347680 | A | 12/2023 |
| TW | 202347696 | A | 12/2023 |
| TW | 202349510 | A | 12/2023 |
| TW | 202349590 | A | 12/2023 |

* cited by examiner

STRUCTURE AND FORMATION METHOD OF PACKAGE WITH INTERPOSER CHIP

PRIORITY CLAIM AND CROSS-REFERENCE

This application claims the benefit of U.S. Provisional Application No. 63/613,161, filed on Dec. 21, 2023, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
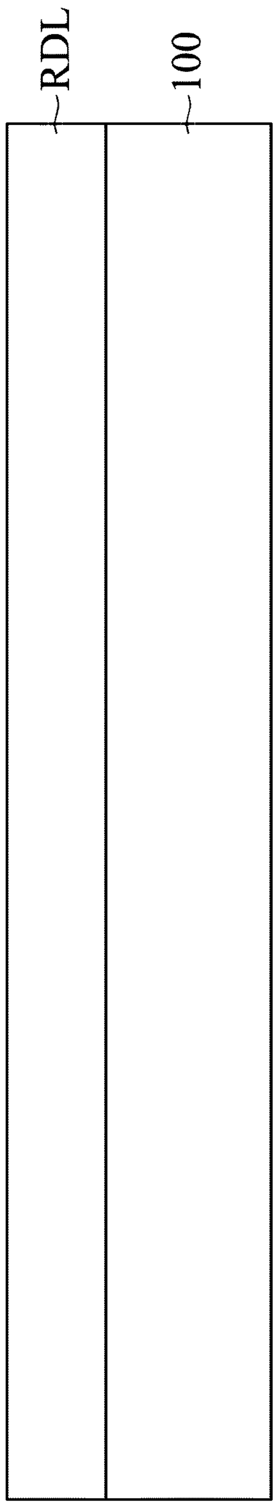
FIGS. 1A-1F are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term “substantially” in the description, such as in “substantially flat” or in “substantially coplanar”, etc., will be understood by the person skilled in the art. In some embodiments the adjective substantially may be removed. Where applicable, the term “substantially” may also include embodiments with “entirely”, “completely”, “all”, etc. Where applicable, the term “substantially” may also relate to 90% or higher of what is specified, such as 95% or higher, especially 99% or higher, including 100%. Furthermore, terms such as “substantially parallel” or “substantially perpendicular” are to be interpreted as not to exclude insignificant deviation from the specified arrangement and may include for example deviations of up to 10 degrees. The word “substantially” does not exclude “completely” e.g. a composition which is “substantially free” from Y may be completely free from Y.

Terms such as “about” in conjunction with a specific distance or size are to be interpreted so as not to exclude insignificant deviation from the specified distance or size and may include for example deviations of up to 10%. The term “about” in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to three-dimensional (3D) packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are cross-sectional views of various stages of a process for forming a portion of a package structure, in accordance with some embodiments. As shown in FIG. 1A, a carrier substrate 100 is provided or received. The carrier substrate 100 is used as a support substrate during the fabrication process. In some embodiments, the carrier substrate 100 is a temporary support carrier and will be removed later.

The carrier substrate 100 may be made of or include a dielectric material, a semiconductor material, one or more other suitable materials, or a combination thereof. In some embodiments, the carrier substrate 100 is a dielectric substrate, such as a glass wafer. In some other embodiments, the carrier substrate 100 is a semiconductor substrate, such as a silicon wafer. The semiconductor substrate may be made of or include silicon, germanium, silicon germanium, another suitable semiconductor material, or a combination thereof.

As shown in FIG. 1A, a redistribution structure RDL is formed over the carrier substrate 100, in accordance with some embodiments. The redistribution structure RDL may include multiple conductive features that are surrounded by multiple insulating layers. The insulating layers may include multiple polymer-containing insulating layers.

The insulating layers of the redistribution structure RDL may be made of or include one or more polymer materials. The polymer material(s) may include polybenzoxazole (PBO), polyimide (PI), epoxy-based resin, another suitable polymer material, or a combination thereof. In some embodiments, the polymer material is photosensitive. A photolithography process may therefore be used to form openings with desired patterns in the insulating layers. These openings may be used to contain some of the conductive features.

The conductive features of the redistribution structure RDL may include conductive lines, conductive vias, and/or conductive pads. The conductive features may be made of or include copper, cobalt, tin, titanium, gold, platinum, aluminum, tungsten, one or more other suitable materials, or a combination thereof. The conductive features may be formed using an electroplating process, an electroless plating process, another applicable process, or a combination thereof. The formation of the conductive features may further involve one or more etching processes and one or more planarization processes.

Figure 1B:
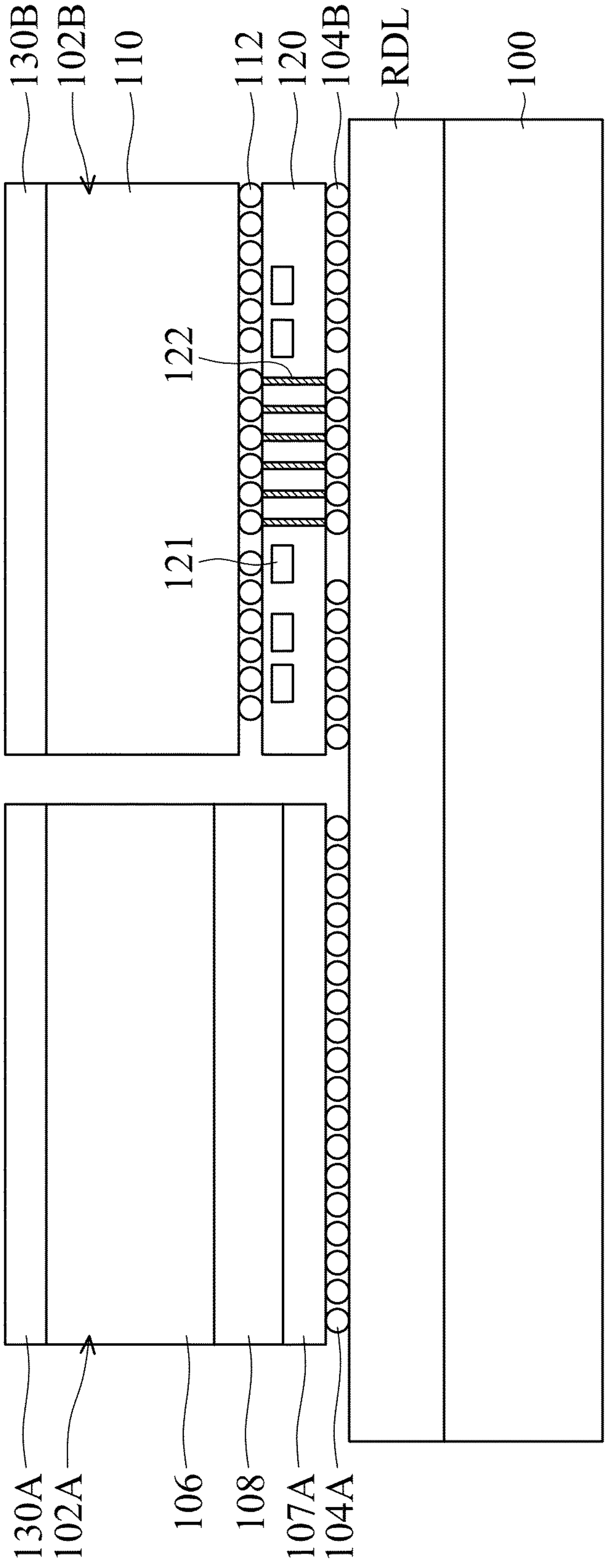

As shown in FIG. 1B, multiple chip structures (or chip-containing structures) are disposed over the redistribution structure RDL, in accordance with some embodiments. In some embodiments, before the chip structures are disposed, a testing operation is performed to the redistribution structure RDL to ensure the quality and reliability of the redistribution structure RDL.

In some embodiments, a chip structure (or a chip-containing structure) 102A is bonded onto the redistribution structure RDL through conductive connectors 104A. The conductive connectors 104A may include solder bumps. The solder bumps may include tin and other materials such as copper, silver, gold, aluminum, lead, another suitable material, or a combination thereof. In some embodiments, the conductive connectors 104A are lead-free solder bumps.

In some embodiments, the chip structure 102A is a logic control chip structure that includes multiple logic control device elements. The chip structure 102A may include a semiconductor substrate portion 106, a device portion 108, and an interconnection structure 107A. The semiconductor substrate portion 106 may include silicon or other elementary semiconductor materials such as germanium. In some embodiments, the semiconductor substrate portion 106 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate portion 106 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

Multiple device elements are formed in and/or on the device portion 108. Examples of the various device elements include transistors (e.g., metal oxide semiconductor field effect transistors (MOSFET), complementary metal oxide semiconductor (CMOS) transistors, bipolar junction transistors (BJT), or another suitable element. Various processes may be used to form the various device elements, including deposition, etching, implantation, photolithography, annealing, and/or other suitable processes.

In some embodiments, the interconnection structure 107A is formed on the device portion 108 for providing electrical connections to the device elements. The interconnection structure 107A may be a frontside interconnection structure. The interconnection structure 107A includes multiple conductive features that are surrounded by multiple dielectric layers. The conductive features may include conductive contacts, conductive lines, and conductive vias. The formation of the interconnection structure 107A may involve multiple deposition processes, multiple patterning processes, and multiple planarization processes.

The device elements in the device portion 108 of the chip structure 102A may be interconnected by the interconnection structure 107A to form multiple integrated circuit devices such as cache elements, global buffer elements, accumulator elements, local buffer elements, activation elements, pooling elements, input and/or output elements, or the like.

The chip structure 102A may be a single semiconductor die, system-on-integrated-chips (SoIC), and/or a package including one or more semiconductor dies that are encapsulated or protected. For the system-on-integrated-chips, multiple semiconductor dies (or chiplets) are stacked and bonded together to form electrical connections between these semiconductor dies. In some embodiments, the semiconductor dies are system-on-chip (SoC) chips that include multiple functions. In some embodiments, the back sides of the semiconductor dies face upwards with the front sides of the semiconductor dies facing the redistribution structure RDL.

In some embodiments, a thermal conductive layer 130A is formed on the chip structure 102A, as shown in FIG. 1B. The thermal conductive layer 130A functions as a thermal interface material. The thermal conductive layer 130A may be made of or include a polymer material including silicone or epoxy. The thermal conductive layer 130A may further contain particles dispersed in the polymer material. The particles may be made of or include dielectric particles such as aluminum oxide and/or zinc oxide, metal particles such as gold and/or silver, other suitable particles, or a combination thereof.

In some other embodiments, the thermal conductive layer 130A is made of or includes a solid material or a liquid material. The solid material may include tin (Sn), Indium (In), Bismuth (Bi), another suitable material, an alloy thereof, or a combination thereof. The liquid material may include gallium (Ga), alloys thereof, or a resin material containing gallium (Ga) or alloys thereof.

As shown in FIG. 1B, a chip structure (or a chip-containing structure) 102B is bonded to an interposer chip 120 through multiple conductive connectors 112, in accordance with some embodiments. The interposer chip 120 is further bonded onto the redistribution structure RDL through multiple conductive connectors 104B. The conductive connectors 104B and 112 may include solder bumps. The solder bumps may include tin and other materials such as copper, silver, gold, aluminum, lead, another suitable material, or a combination thereof. In some embodiments, the conductive connectors 104B and 112 are lead-free solder bumps. In some embodiments, each of the conductive connectors 104B is wider than each of the conductive connectors 112. In some embodiments, the pitch between the conductive connectors 104B is wider than the pitch between the conductive connectors 112.

In some embodiments, the chip structure 102B is a memory-containing chip structure that includes multiple memory device elements. In some embodiments, the chip structure 102B includes memory devices such as dynamic random access memory (DRAM) devices, high bandwidth memory (HBM) devices, or the like. In some embodiments, the memory device elements are non-volatile memory elements such as static random access memory (SRAM) elements, resistive random access memory (RRAM) elements, magnetoresistive random access memory (MRAM) elements, or the like.

Multiple device elements are formed in the device portion 110 of the chip structure 102B. Examples of the various device elements include transistors (e.g., metal oxide semiconductor field effect transistors (MOSFET), complementary metal oxide semiconductor (CMOS) transistors, bipolar junction transistors (BJT), or another suitable element. Various processes may be used to form the various device elements, including deposition, etching, implantation, photolithography, annealing, and/or other suitable processes.

The chip structure 102B may be a single semiconductor die, system-on-integrated-chips (SoIC), and/or a package including one or more semiconductor dies that are encapsulated or protected. For the system-on-integrated-chips, multiple semiconductor dies (or chiplets) are stacked and bonded together to form electrical connections between these semiconductor dies. In some embodiments, multiple memory dies are stacked to form a high bandwidth memory (HBM) chip structure.

In some embodiments, the interposer chip 120 includes multiple through substrate vias (TSVs) 122, as shown in FIG. 1B. The TSVs 122 may be used to form electrical connection between the chip structure 102B and the redistribution structure RDL. One or more dielectric layers may be formed to laterally surround each of the TSVs 122, so as to prevent short circuiting between the TSVs 122.

In some embodiments, the interposer chip 120 includes one or more active devices 121 formed therein. The active devices 121 may be used to provide electrical communication between some devices of the chip structure 102A and some devices of the chip structure 102B. In some embodiments, one of the active device is electrically connected to one or more memory devices of the chip structure 102B and one or more of logic devices of the chip structure 102A through some of the conductive features of the redistribution structure RDL.

In some embodiments, the active devices 121 formed in the interposer chip 120 include analog-to-digital converter (ADC) elements or the like. The ADC elements may be used to convert the analog signals from the chip structure 102B into digital signals. Afterwards, the digital signals may be further transferred to the chip structure 102A through the redistribution structure RDL for further operation. Due to the assistance of the active devices 121 formed in the interposer chip 120 that is nearby, a large amount of electrical signal is operated by the active devices 121 of the interposer chip 120 without being transmitted to the chip structure 102A directly. The operation speed is thus greatly improved. The heat generated during operation is also significantly reduced, which leads to a low operation temperature and high performance.

In some embodiments, a thermal conductive layer 130B is formed on the chip structure 102B, as shown in FIG. 1B. The thermal conductive layer 130B functions as a thermal interface material. The thermal conductive layer 130B may be made of or include a polymer material including silicone or epoxy. The thermal conductive layer 130B may further contain particles dispersed in the polymer material. The particles may be made of or include dielectric particles such as aluminum oxide and/or zinc oxide, metal particles such as gold and/or silver, other suitable particles, or a combination thereof.

In some other embodiments, the thermal conductive layer 130B is made of or includes a solid material or a liquid material. The solid material may include tin (Sn), Indium (In), Bismuth (Bi), another suitable material, an alloy thereof, or a combination thereof. The liquid material may include gallium (Ga), alloys thereof, or a resin material containing gallium (Ga) or alloys thereof.

Figure 1C:
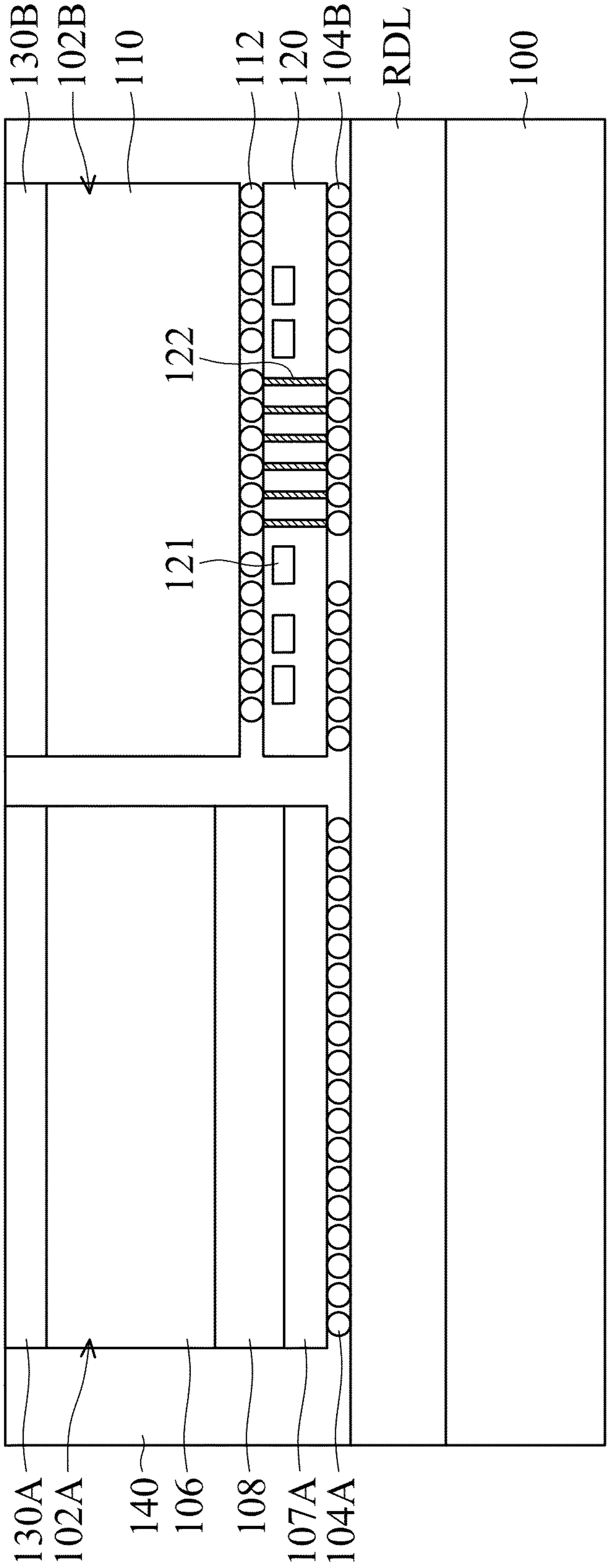

As shown in FIG. 1C, a protective layer 140 is formed over the redistribution structure RDL to laterally surround and protect the chip structures 102A and 102B and the interposer chip 120, in accordance with some embodiments. In some embodiments, the protective layer 140 is in physical contact with the redistribution structure RDL.

In some embodiments, the protective layer 140 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof.

In some embodiments, a molding material (such as a liquid molding material) is introduced or injected to cover the redistribution structure RDL, the chip structures 102A and 102B, and the interposer chip 120. In some embodiments, a thermal process is then used to cure the liquid molding material and to transform it into the protective layer 140.

In some embodiments, a planarization process is performed to the protective layer 140 to improve the flatness of the protective layer 140. For example, the planarization process may include a grinding process, a CMP process, a dry polishing process, one or more other applicable processes, or a combination thereof. In some embodiments, after the planarization process, the top surface of the protective layer 140 is substantially level with the surfaces of the thermal conductive layers 130A and 130B.

Figure 1D:
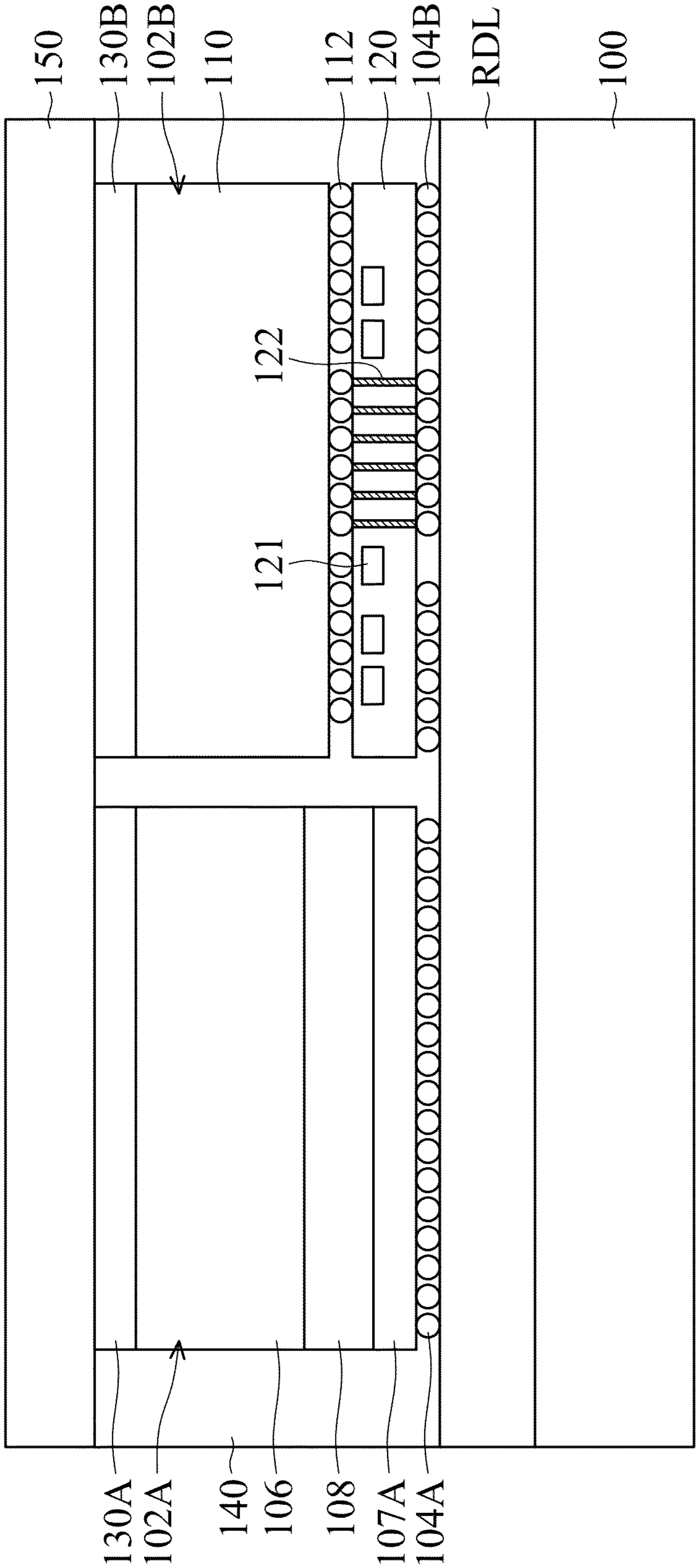

As shown in FIG. 1D, a heat-spreading lid 150 is disposed over the protective layer 140 and the thermal conductive layers 130A and 130B, in accordance with some embodiments. The heat-spreading lid 150 may help to improve the heat dissipation of the chip structures 102A and 102B, so as to improve the operation and reliability of the chip structures 102A and 102B.

The heat-spreading lid 150 may be made of or include copper, nickel, aluminum, gold, silver, steel, another suitable material, or a combination thereof. In some embodiments, the heat-spreading lid 150 has a main body that is made of or include copper. The heat-spreading lid 150 may further have one or more other layers coated on the main body. For example, these layers may include an inner layer made of nickel and one or more outer layers that are made of gold and/or silver.

Figure 1E:
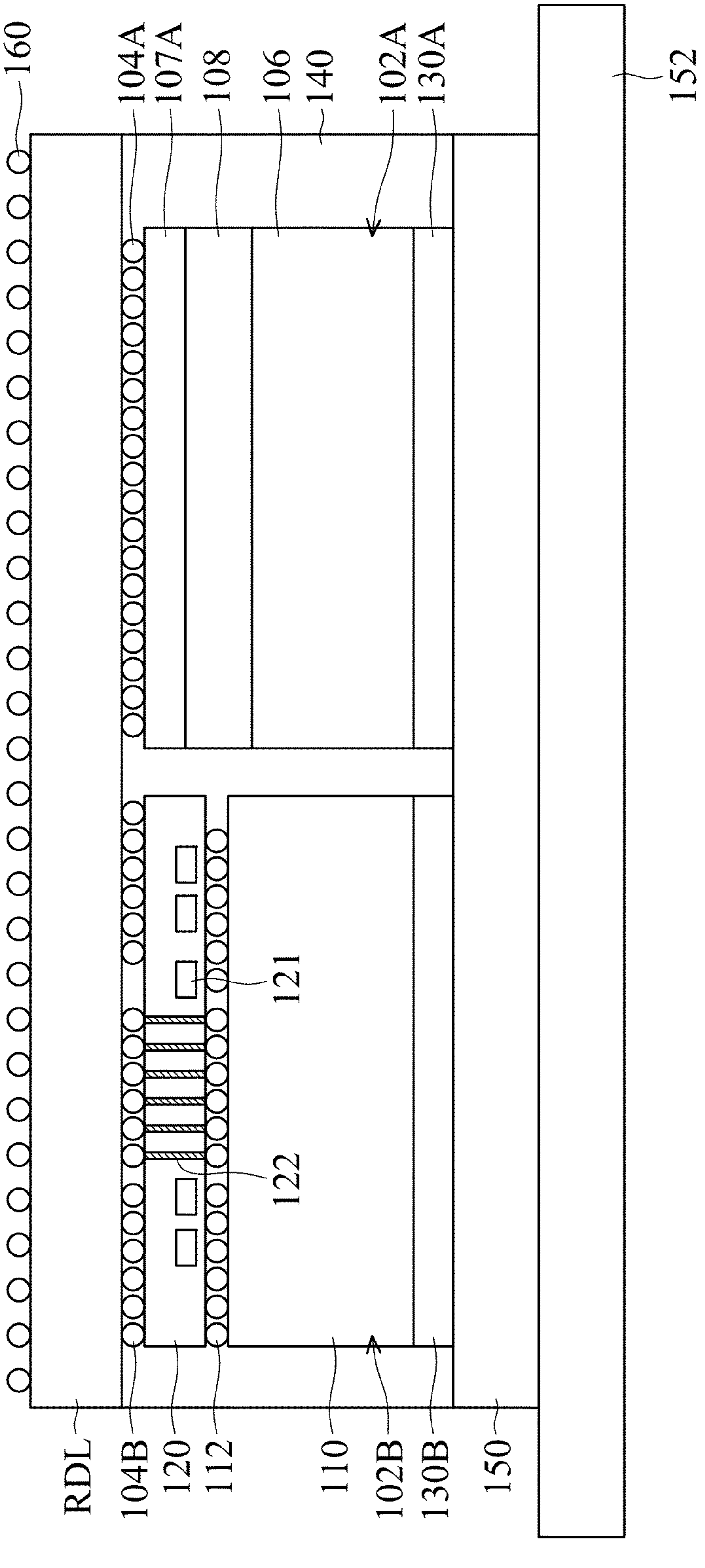

As shown in FIG. 1E, the structure shown in FIG. 1D is flipped upside down and attached onto a carrier tape 152, in accordance with some embodiments. Afterwards, the carrier substrate 100 is removed, as shown in FIG. 1E in accordance with some embodiments. As a result, the surface of the redistribution structure RDL that is originally covered by the carrier substrate 100 is exposed.

Afterwards, multiple conductive connectors 160 are formed over the exposed surface of the redistribution structure RDL, as shown in FIG. 1E in accordance with some embodiments. The conductive connectors 160 may include solder bumps. The solder bumps may include tin and other materials such as copper, silver, gold, aluminum, lead, another suitable material, or a combination thereof. In some embodiments, the conductive connectors 160 are lead-free solder bumps. In some embodiments, each of the conductive connectors 160 is wider than each of the conductive connectors 104A and 104B. In some embodiments, the pitch between the conductive connectors 160 is wider than the pitch between the conductive connectors 104A or 104B.

Figure 1F:
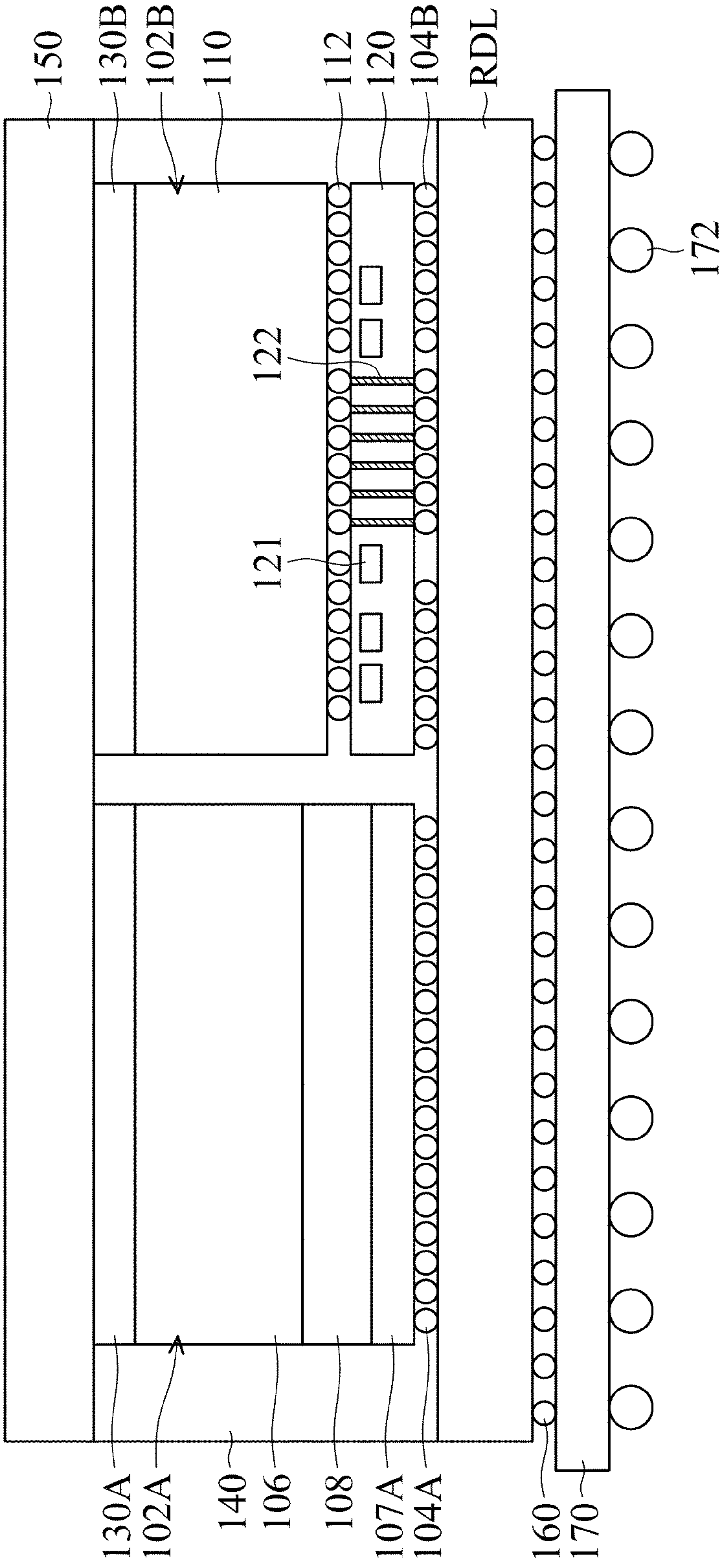

In some embodiments, a singulation process (e.g., sawing or the like) is then used to cut through the structure shown in FIG. 1E into multiple package structures. After the sawing process, one of the package structures is picked from the carrier tape 152 and turned upside down, as shown in FIG. 1F in accordance with some embodiments. The structure is then bonded to a substrate 170 through the conductive connectors 160, as shown in FIG. 1F. In some other embodiments, the heat-spreading lid 150 is disposed over the chip structures 102A and 102B after bonding with the substrate 170.

However, embodiments of the disclosure are not limited thereto. Many variations and/or modifications can be made to embodiments of the disclosure. In some other embodiments, the sawing process is not performed to separate the structure in FIG. 1E into multiple smaller die packages. The entirety of the wafer-level package structure may directly be integrated into a large package structure without being sawed. Additionally, in some embodiments the heat-spreading lid 150 may be attached after the singulation process.

The substrate 170 may be a circuit substrate (or a package substrate). In some embodiments, the substrate 170 includes a core portion. The substrate 170 may further includes multiple insulating layers and multiple conductive features. The conductive features may be used to route electrical signals between opposite sides of the substrate 170. The insulating layers may be made of or include one or more polymer materials. The conductive features may be made of or include copper, aluminum, cobalt, tungsten, gold, one or more other suitable materials, or a combination thereof.

The core portion of the substrate 170 may include organic materials such as materials that can be easily laminated. In some embodiments, the core portion may include a single-sided or double-sided copper clad laminate, epoxy, resin, glass fiber, molding compound, plastic (such as polyvinylchloride (PVC), acrylonitril, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), one or more other suitable elements, or a combination thereof. Conductive vias may extend through the core portion to provide electrical connections between elements disposed on either side of the core portion.

In some embodiments, the substrate 170 further includes bonding structures 172. In some embodiments, the bonding structures 172 are solder bumps. In some embodiments, the bonding structures 172 are used for bonding with another element such as a printed circuit board.

In some embodiments, the bonding structures 172 are lead-free solder bumps. In some embodiments, each of the bonding structures 172 is wider than each of the conductive connectors 160. In some embodiments, the pitch between the bonding structures 172 is wider than the pitch between the conductive connectors 160.

As shown in FIG. 1F, in some embodiments, due to the assistance of the active devices 121 formed in the interposer chip 120, the operation heat generated during the operation of the chip structures 102A and 102B is significantly reduced. The performance and reliability of the package structure are thus greatly improved.

Many variations and/or modifications can be made to embodiments of the disclosure. In some other embodiments, one or more local interconnection chips are used to improve the interconnection between the chip structures 102A and 102B.

Figure 2A:
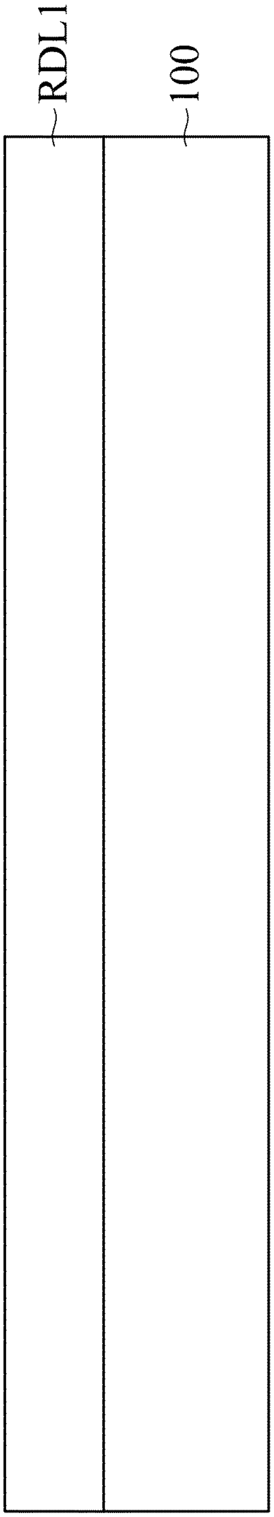
FIGS. 2A-2G are cross-sectional views of various stages of a process for forming a portion of a package structure, in accordance with some embodiments.

FIGS. 2A-2G are cross-sectional views of various stages of a process for forming a portion of a package structure, in accordance with some embodiments. As shown in FIG. 2A, similar to the embodiments illustrated in FIG. 1A, a redistribution structure RDL1 is formed over a carrier substrate 100, in accordance with some embodiments. The material and formation method of the redistribution structure RDL1 may be the same as or similar to those of the redistribution structure RDL shown in FIG. 1A.

Figure 2B:
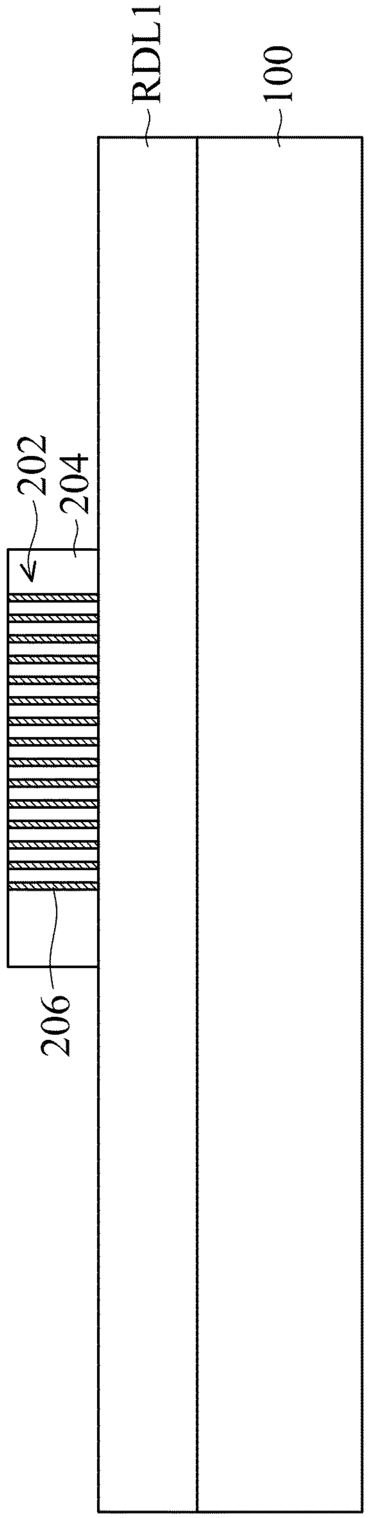

As shown in FIG. 2B, a local interconnection chip 202 (e.g., a local silicon interconnect (LSI) or the like) is disposed over the redistribution structure RDL1, in accordance with some embodiments. The local interconnection chip 202 may be used to receive and/or transfer electrical signals to and/or from other chip structures that will be disposed later. In some embodiments, the local interconnection chip 202 has no active devices formed therein. In some other embodiments, the local interconnection chip 202 includes active devices and/or passive devices formed therein.

In some embodiments, the local interconnection chip 202 includes a semiconductor substrate portion 204 and multiple conductive features 206. In some embodiments, the conductive features 206 include through substrate vias. In some embodiments, the local interconnection chip 202 further include conductive lines that provide electrical connection between some of the through substrate vias. In some embodiments, one or more dielectric layers are formed to laterally surround the conductive features 206, so as to prevent short circuiting between the conductive features 206.

Figure 2C:
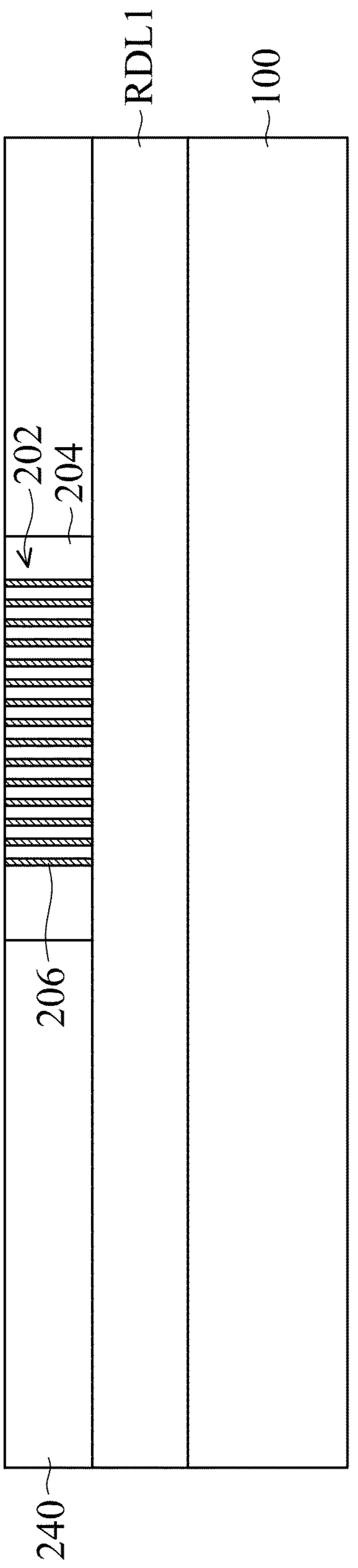

As shown in FIG. 2C, a protective layer 240 is formed over the redistribution structure RDL1 to laterally surround the local interconnection chip 202, in accordance with some embodiments. The material and formation method of the protective layer 240 may be the same as or similar to those of the protective layer 140 shown in FIG. 1C.

Figure 2D:
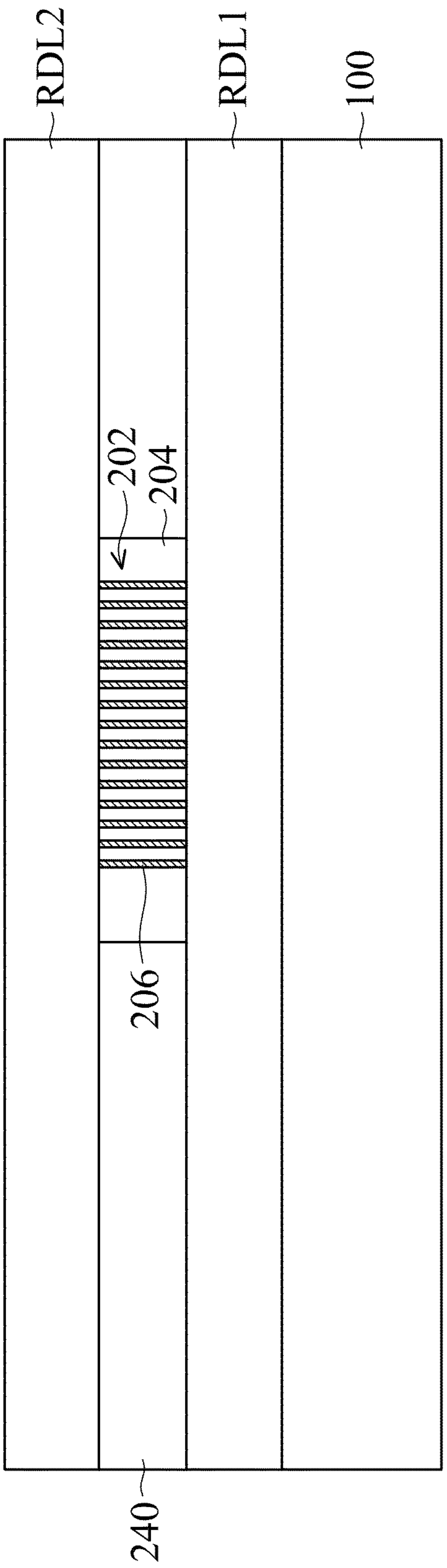

As shown in FIG. 2D, a redistribution structure RDL2 is formed over the protective layer 240 and the local interconnection chip 202, in accordance with some embodiments. The material and formation method of the redistribution structure RDL2 may be the same as or similar to those of the redistribution structure RDL shown in FIG. 1A. Some of the conductive features of the redistribution structure RDL2 are electrically connected to some of the conductive features 206 of the local interconnection chip 202.

Figure 2E:
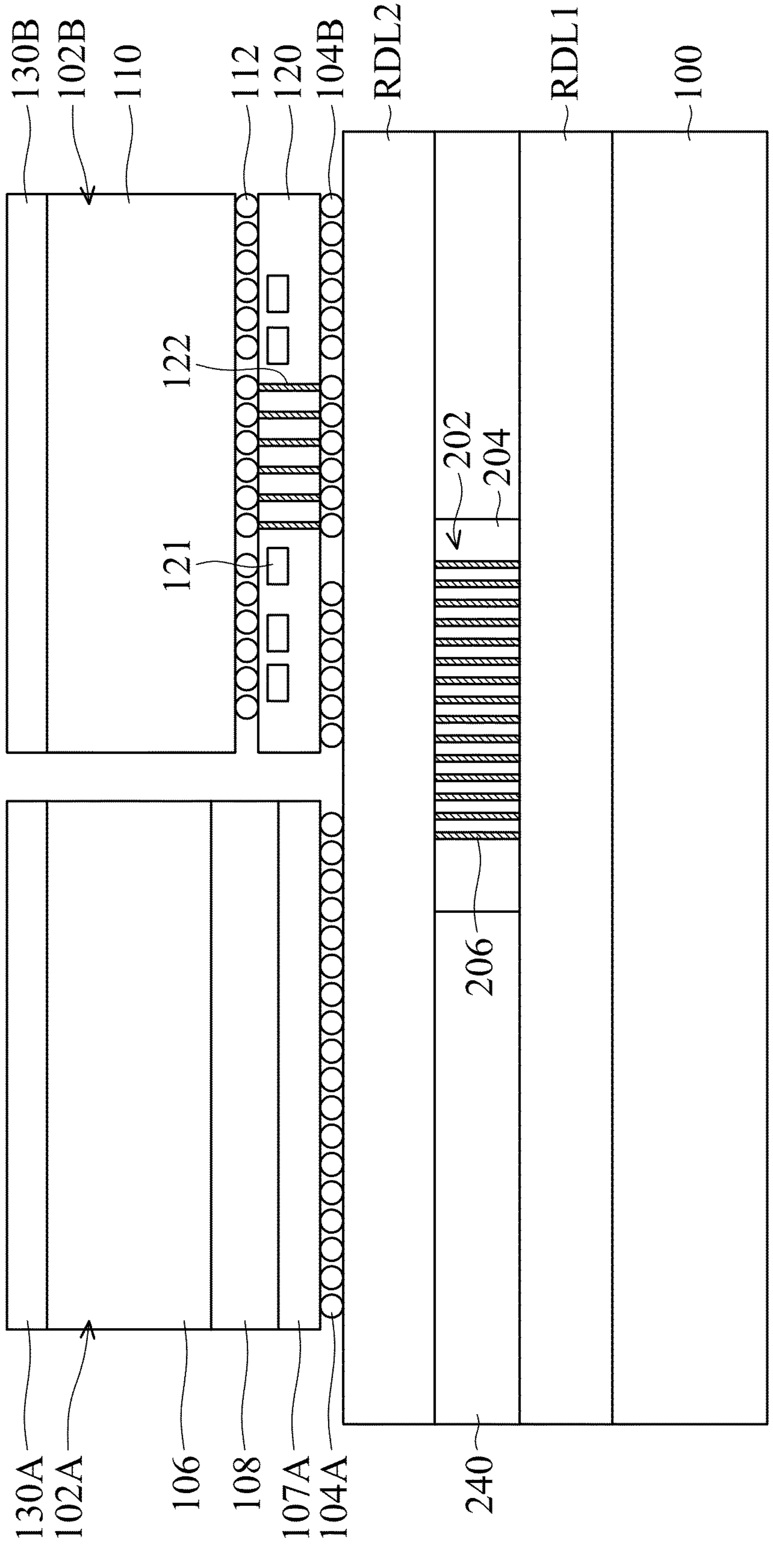

As shown in FIG. 2E, similar to the embodiments illustrated in FIG. 1B, the chip structure 102A and the interposer chip 120 that carriers the chip structure 102B are bonded onto the redistribution structure RDL2, in accordance with some embodiments. In some embodiments, the top surfaces of the chip structures 102A and 102B are substantially level. In some embodiments, the top surfaces of the thermal conductive layers 130A and 130B are substantially level.

In some embodiments, the local interconnection chip 202 extends across the nearby sidewalls of the chip structures 102A and 102B, as shown in FIG. 2E. In some embodiments, the local interconnection chip 202 extends across the gap between the chip structures 102A and 102B. In some embodiments, the local interconnection chip 202 extends across the gap between the chip structure 102A and the interposer chip 120. In some embodiments, due to the local interconnection chip 202, the electrical communication between the chip structure 102A and the interposer chip 120 (and the chip structure 102B thereabove) is improved.

Figure 2F:
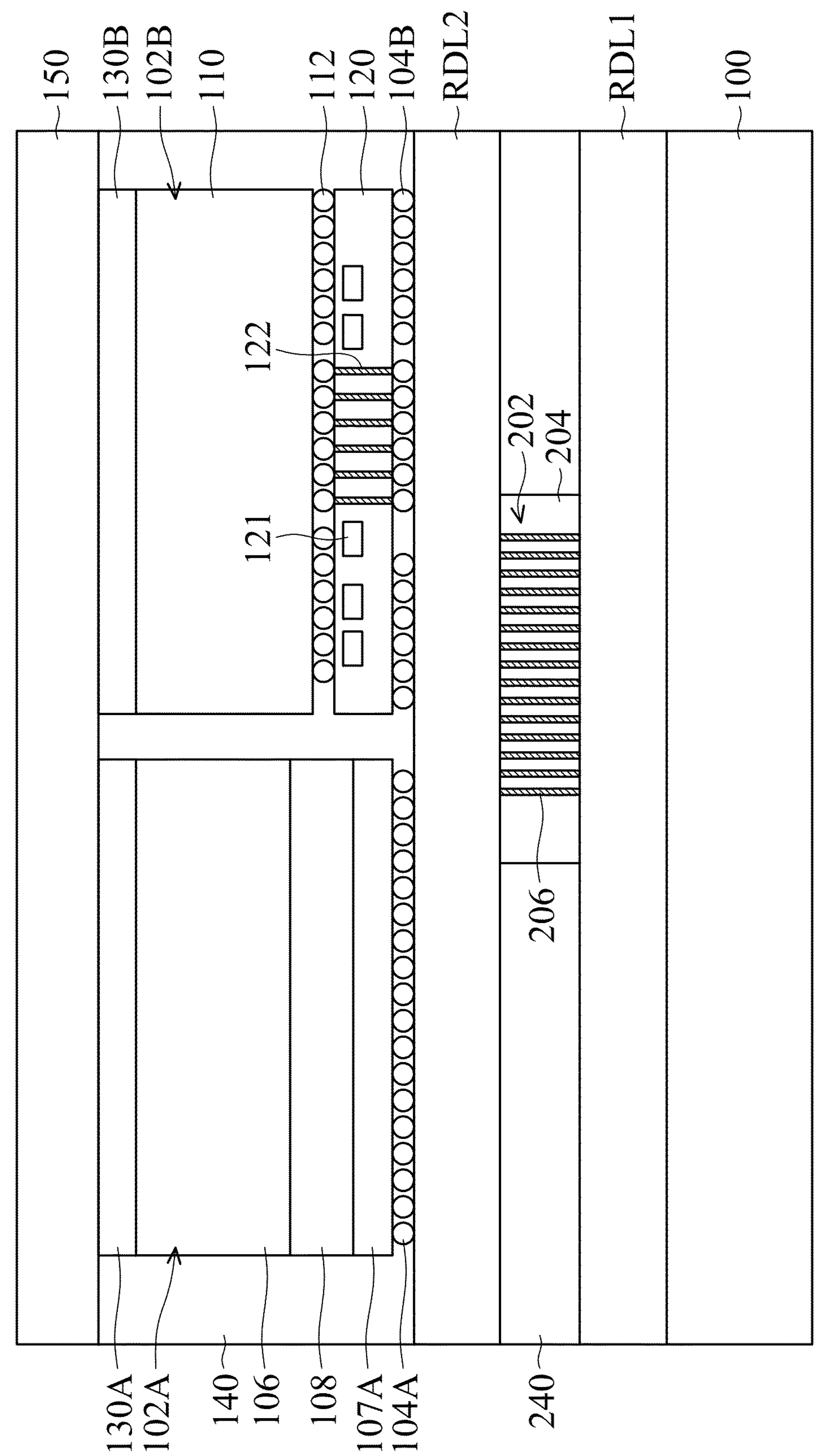

As shown in FIG. 2F, a protective layer 140 is formed over the redistribution structure RDL2 to laterally surround and protect the interposer chip 120 and the chip structures 102A and 102B, in accordance with some embodiments. The material and formation method of the protective layer 140 may be the same as or similar to those of the protective layer 140 shown in FIG. 1C.

Afterwards, similar to the embodiments illustrated in FIG. 1D, a heat-spreading lid 150 is disposed over the thermal conductive layers 130A and 130B, as shown in FIG. 2F in accordance with some embodiments. The heat-spreading lid 150 extends across the opposite sidewalls of the chip structure 102A, the opposite sidewalls of the chip structure 102B, and the opposite sidewalls of the interposer chip 120. Similar to that discussed above with reference to FIG. 1F, a singulation process may be performed to separate individual package structures. The heat-spreading lid 150 may be attached before or after the singulation process.

Figure 2G:
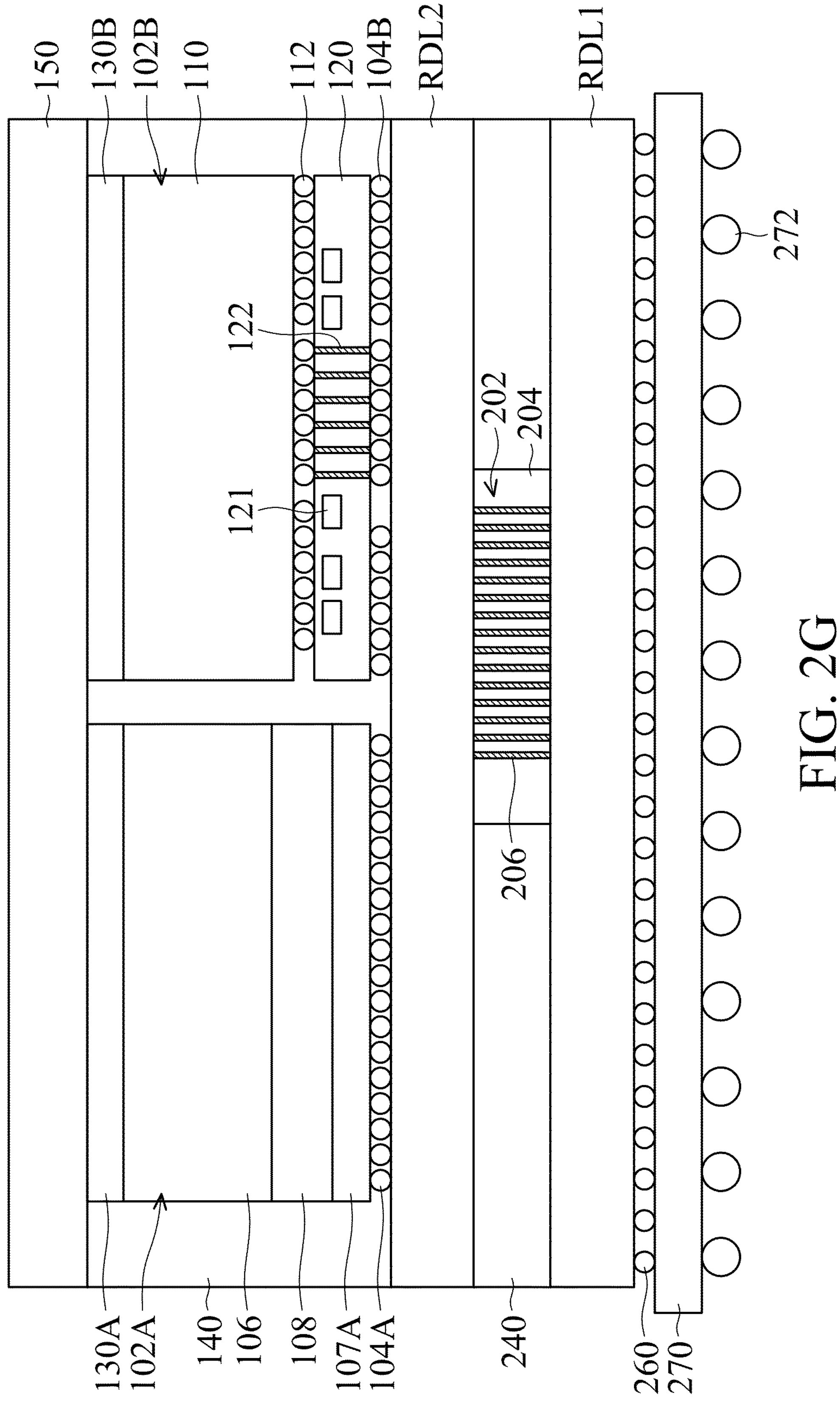

As shown in FIG. 2G, similar to the embodiments illustrated in FIGS. 1E-1F, the carrier substrate 100 is removed, and the redistribution structure RDL1 is bonded to a substrate 270 through multiple conductive connectors 260, in accordance with some embodiments. The conductive connectors 260 may be the same as or similar to the conductive connectors 160 shown in FIGS. 1E-1F.

The substrate 270 may be the same as or similar to the substrate 170 shown in FIG. 1F. Similar to the substrate 170, the substrate 270 includes multiple bonding structures 272. In some embodiments, the bonding structures 272 are solder bumps. In some embodiments, the bonding structures 272 are used for bonding with another element such as a printed circuit board.

In some embodiments, the chip structure 102B is substantially as wide as the interposer chip 120. However, embodiments of the disclosure are not limited thereto. Many variations and/or modifications can be made to embodiments of the disclosure. In some other embodiments, the chip structure 102B and the interposer chip 120 have different widths.

Figure 3:
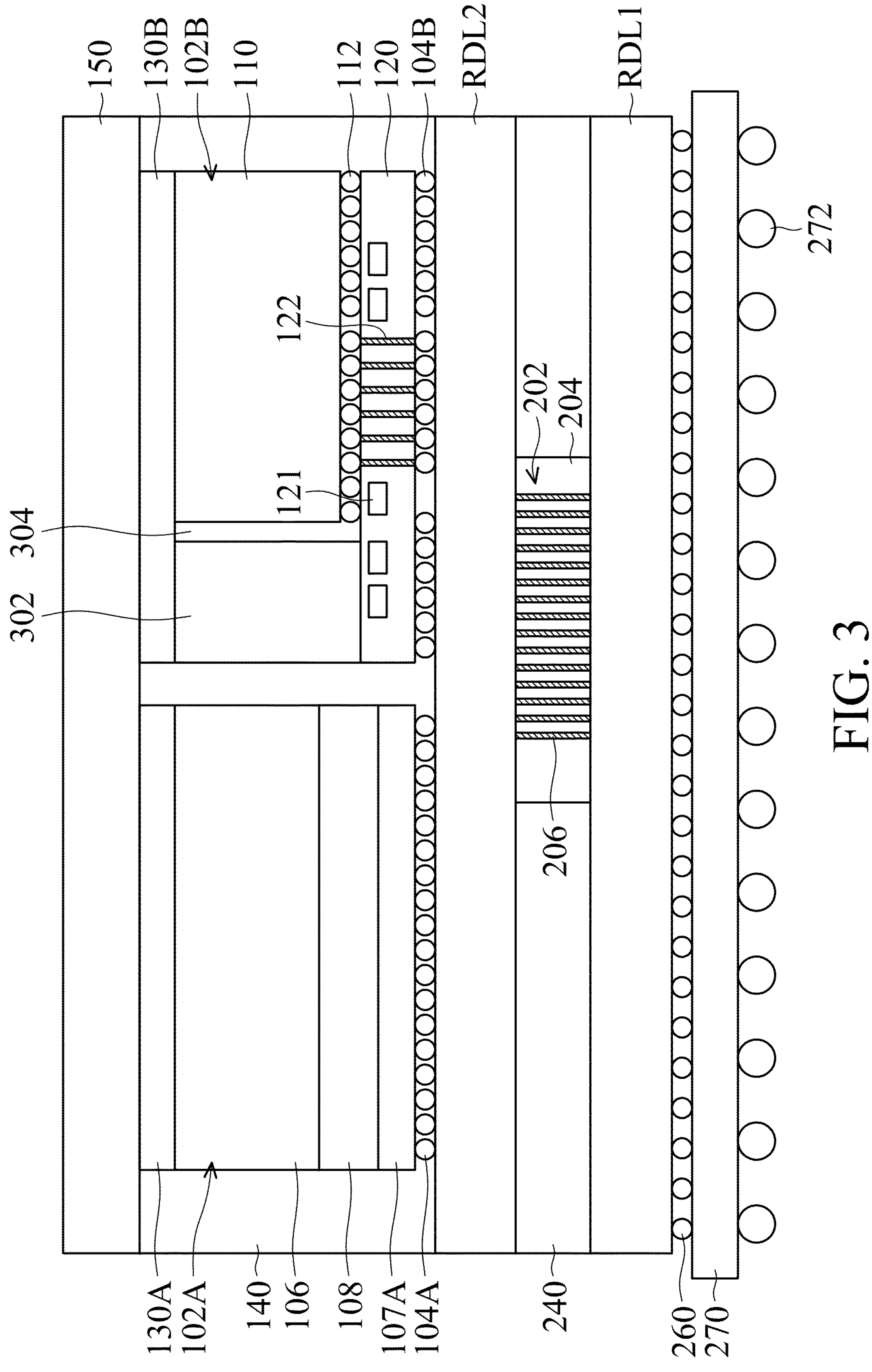
FIG. 3 is a cross-sectional view of a portion of a package structure, in accordance with some embodiments.

FIG. 3 is a cross-sectional view of a portion of a package structure, in accordance with some embodiments. In some embodiments, the interposer chip 120 is wider than the chip structure 102B. In some embodiments, a dummy chip 302 is disposed over the interposer chip 120. In some embodiments, the dummy chip 302 is free of active devices. The dummy chip 302 is spaced apart from the chip structure 102B. In some embodiments, the top surface of the dummy chip 302 is substantially level with the top surface of the chip structure 102B.

In some embodiments, a protective layer 304 is formed over the interposer chip 120 to laterally surround and protect the dummy chip 302 and the chip structure 102B. The material and formation method of the protective layer 304 may be the same as or similar to those of the protective layer 140. The protective layer 304 fills the gap between the dummy chip 302 and the chip structure 102B.

Figure 10A:
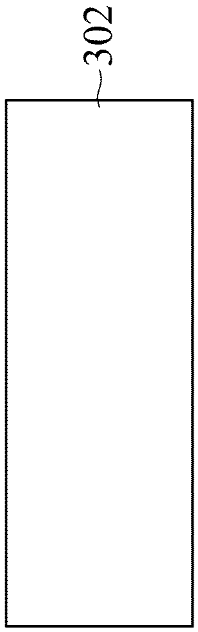
FIG. 10A is a cross-sectional view of a portion of a package structure, in accordance with some embodiments.
Figure 10B:
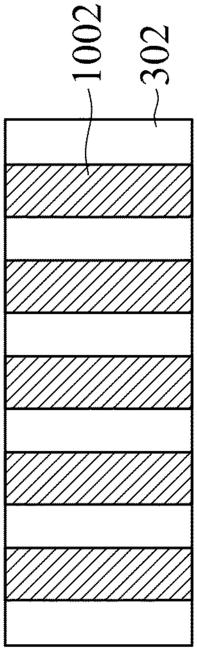
FIG. 10B is a cross-sectional view of a portion of a package structure, in accordance with some embodiments.

FIGS. 10A and 10B are cross-sectional views of a portion of a package structure, in accordance with some embodiments. FIG. 10A shows the cross-sectional view of the dummy chip 302, in accordance with some embodiments. FIG. 10B shows the cross-sectional view of the dummy chip 302, in accordance with some other embodiments.

In some embodiments, the dummy chip 302 includes a semiconductor bulk such as a silicon bulk, as shown in FIGS. 3 and 10A. In some other embodiments, multiple thermal conductive vias 1002 are formed within the dummy chip 302. The thermal conductive vias 1002 may help to reduce the stress of the dummy chip 302 and to improve the heat dissipation of the package structure. The performance and reliability of the package structure may thus be improved.

In some embodiments, the thermal conductive vias 1002 are in direct contact with the dummy chip 302. There is no dielectric layer formed between the dummy chip 302 and the thermal conductive vias 1002. The thermal conductive vias 1002 may be made of or include copper, aluminum, tungsten, cobalt, another suitable material, or a combination thereof.

In some embodiments, the chip structure 102A and the interposer chip 120 are bonded to a redistribution structure that includes multiple polymer-containing insulating layers and multiple conductive features. However, embodiments of the disclosure are not limited thereto. Many variations and/or modifications can be made to embodiments of the disclosure. In some other embodiments, the chip structure 102A and the interposer chip 120 are bonded to a semiconductor interposer.

Figure 4:
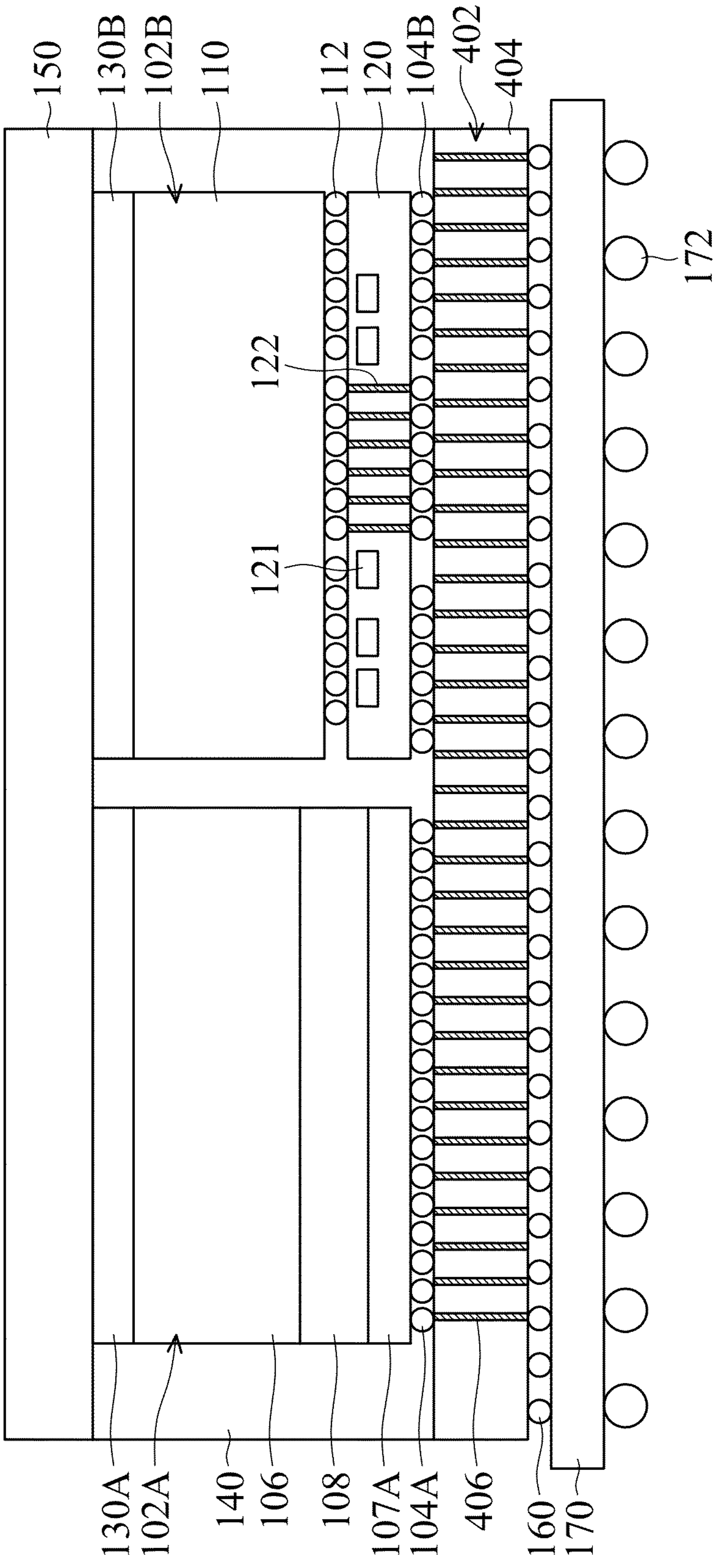
FIG. 4 is a cross-sectional view of a portion of a package structure, in accordance with some embodiments.

FIG. 4 is a cross-sectional view of a portion of a package structure, in accordance with some embodiments. In some embodiments, the chip structure 102A and the interposer chip 120 that carries the chip structure 102B are bonded onto a semiconductor interposer 402. The semiconductor interposer 402 may include a semiconductor substrate 404 and multiple conductive features 406.

The semiconductor substrate 404 may be made of or include silicon. The conductive features 406 may include through substrate vias (TSVs) that penetrate through the semiconductor substrate 404. In some embodiments, one or more dielectric layers surrounding the conductive features 406 are used to prevent short circuiting between the conductive features 406.

In some embodiments, interconnection structures are formed over the opposite surfaces of the semiconductor substrate 404. The interconnection structures may include multiple dielectric layers and multiple conductive features.

In some embodiments, the chip structure 102B is bonded to the interposer chip 120 through tin-containing solder bumps. However, embodiments of the disclosure are not limited thereto. Many variations and/or modifications can be made to embodiments of the disclosure. In some other embodiments, the chip structure 102B is bonded to the interposer chip 120 through dielectric-to-dielectric bonding and metal-to-metal bonding.

Figure 5:
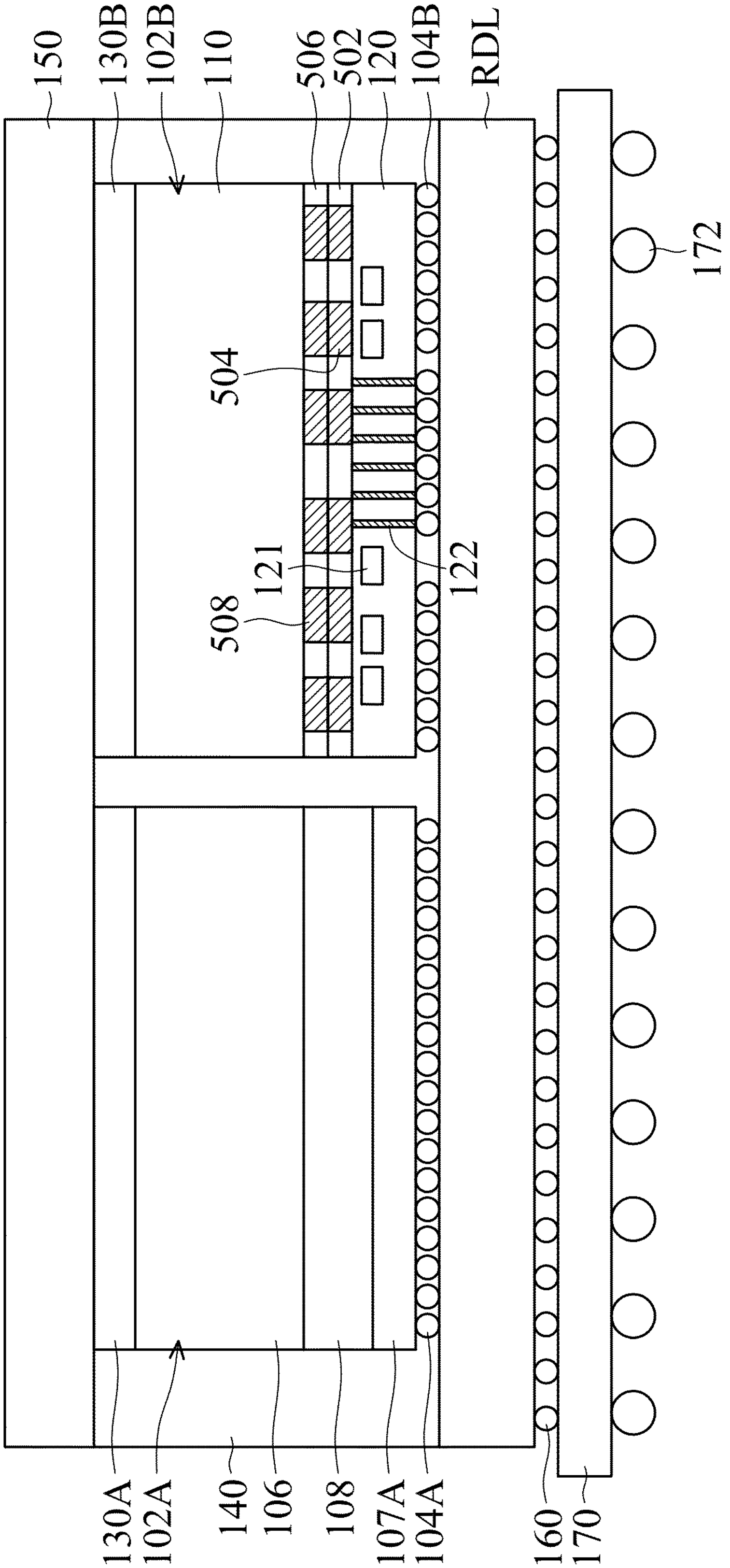
FIG. 5 is a cross-sectional view of a portion of a package structure, in accordance with some embodiments.

FIG. 5 is a cross-sectional view of a portion of a package structure, in accordance with some embodiments. In some embodiments, the interposer chip 120 further includes multiple metal bonding structures 504 and a dielectric bonding structure 502 that surrounds the metal bonding structures 504. In some embodiments, a planarization process such as a chemical mechanical polishing (CMP) process is used to ensure that the top surfaces of the metal bonding structures 504 and the top surface of the dielectric bonding structure 502 are substantially coplanar. The planarization process may help to provide the interposer chip 120 with a highly planarized bonding surface.

In some embodiments, the chip structure 102B further includes multiple metal bonding structures 508 and a dielectric bonding structure 506 that surrounds the metal bonding structures 508. In some embodiments, a planarization process such as a CMP process is used to ensure that the top surfaces of the metal bonding structures 508 and the top surface of the dielectric bonding structure 506 are substantially coplanar. The planarization process may help to provide the chip structure 102B with a highly planarized bonding surface.

In some embodiments, the chip structure 102B is placed directly on the interposer chip 120. As a result, the dielectric bonding structures 502 and 506 are in direct contact with each other and bonded to each other. The metal bonding structures 504 and 508 are in direct contact with each other.

As mentioned above, before the placing of the chip structure 102B, planarization processes are performed, so as to provide highly planarized bonding surfaces of the chip structure 102B and the interposer chip 120. In some embodiments, there is no gap between the dielectric bonding structures 502 and 506. In some embodiments, there is no gap between the metal bonding structures 504 and 508. In some embodiments, a thermal operation is then used to enhance the bond between the metal bonding structures 504 and 508. The temperature of the thermal operation may within a range from about 100 degrees C. to about 700 degrees C.

Due to the dielectric-to-dielectric bonding and metal-to-metal bonding, the electrical connection between the chip structure 102B and the interposer chip 120 is significantly improved. The performance and reliability of the package structure are also improved.

Figure 6:
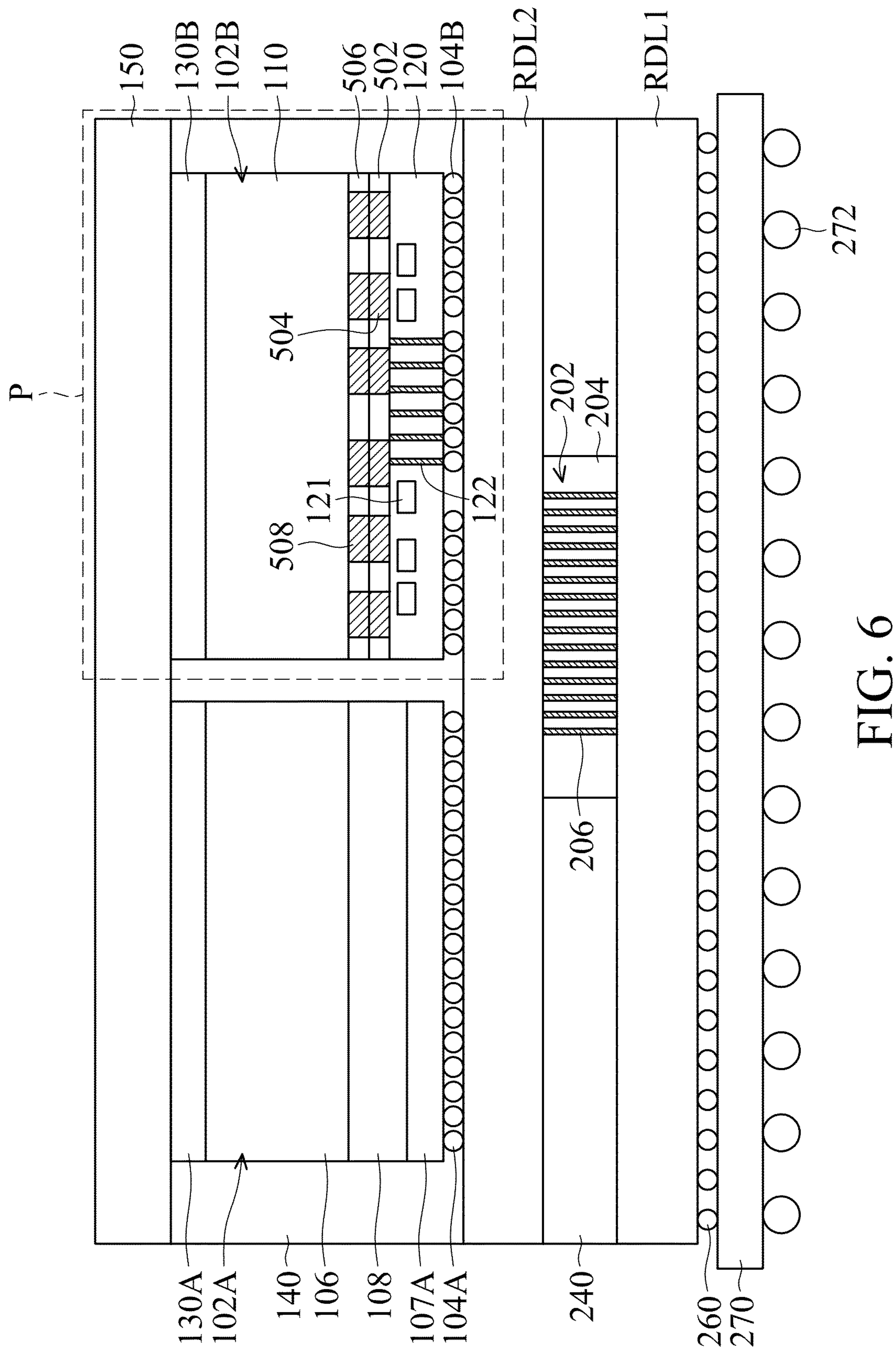
FIG. 6 is a cross-sectional view of a portion of a package structure, in accordance with some embodiments.

Many variations and/or modifications can be made to embodiments of the disclosure. FIG. 6 is a cross-sectional view of a portion of a package structure, in accordance with some embodiments. As shown in FIG. 6, a package structure that is similar to that shown in FIG. 2G is formed. In some embodiments, similar to the embodiments illustrated in FIG. 5, the chip structure 102B and the interposer chip 120 are directly bonded together through dielectric-to-dielectric bonding (e.g., the bond between the dielectric bonding structures 502 and 506) and metal-to-metal bonding (e.g., the bond between the metal bonding structures 504 and 508).

Figure 7:
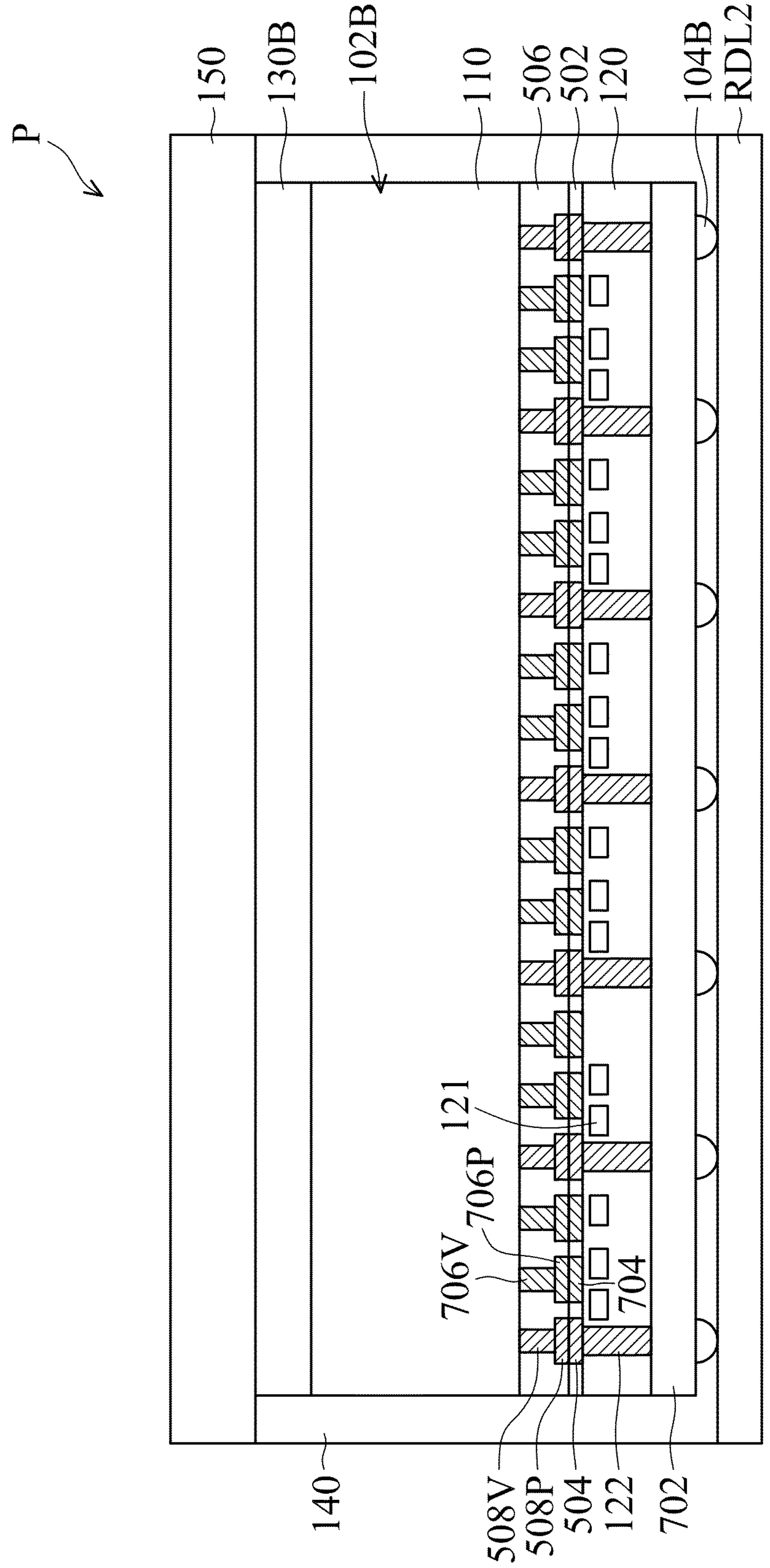
FIG. 7 is a cross-sectional view of a portion of a package structure, in accordance with some embodiments.

FIG. 7 is a cross-sectional view of a portion of a package structure, in accordance with some embodiments. In some embodiments, FIG. 7 shows the cross-sectional view of the portion P of the structure shown in FIG. 6. In some embodiments, the interposer chip 120 includes an interconnection structure 702 that has multiple dielectric layers and multiple conductive features. The conductive features of the interconnection structure 702 form electrical connections between the TSVs 122 and the conductive connectors 104B. In some embodiments, the metal bonding structures 504 of the interposer chip 120 are electrically connected to the TSVs 122.

In some embodiments, the interposer chip 120 further includes multiple dummy metal bonding pads 704 that are laterally surrounded by the dielectric bonding structure 502. In some embodiments, the dummy metal bonding pads 704 are not electrically connected to other device elements.

In some embodiments, the chip structure 102B further includes multiple conductive vias 508V and multiple metal bonding pads 508P. The conductive vias 508V and the metal bonding pads 508P together form multiple metal bonding structures. In some embodiments, the metal bonding pads 508P are electrically connected to the device elements (such as memory device elements) of the chip structure 102B through the conductive vias 508V.

In some embodiments, the chip structure 102B further includes multiple dummy metal bonding pads 706P and dummy conductive vias 706V that are laterally surrounded by the dielectric bonding structure 506. The dummy metal bonding pads 706P and the dummy conductive vias 706V together form multiple dummy metal bonding structures. In some embodiments, the dummy metal bonding pads 706P are not electrically connected to other device elements. The dummy metal bonding pads 704 and 706P are used to enhance the bond between the interposer chip 120 and the chip structure 102B. In some embodiments, the dummy metal bonding pads 704 and 706P are not used for signal transmission.

Figure 8:
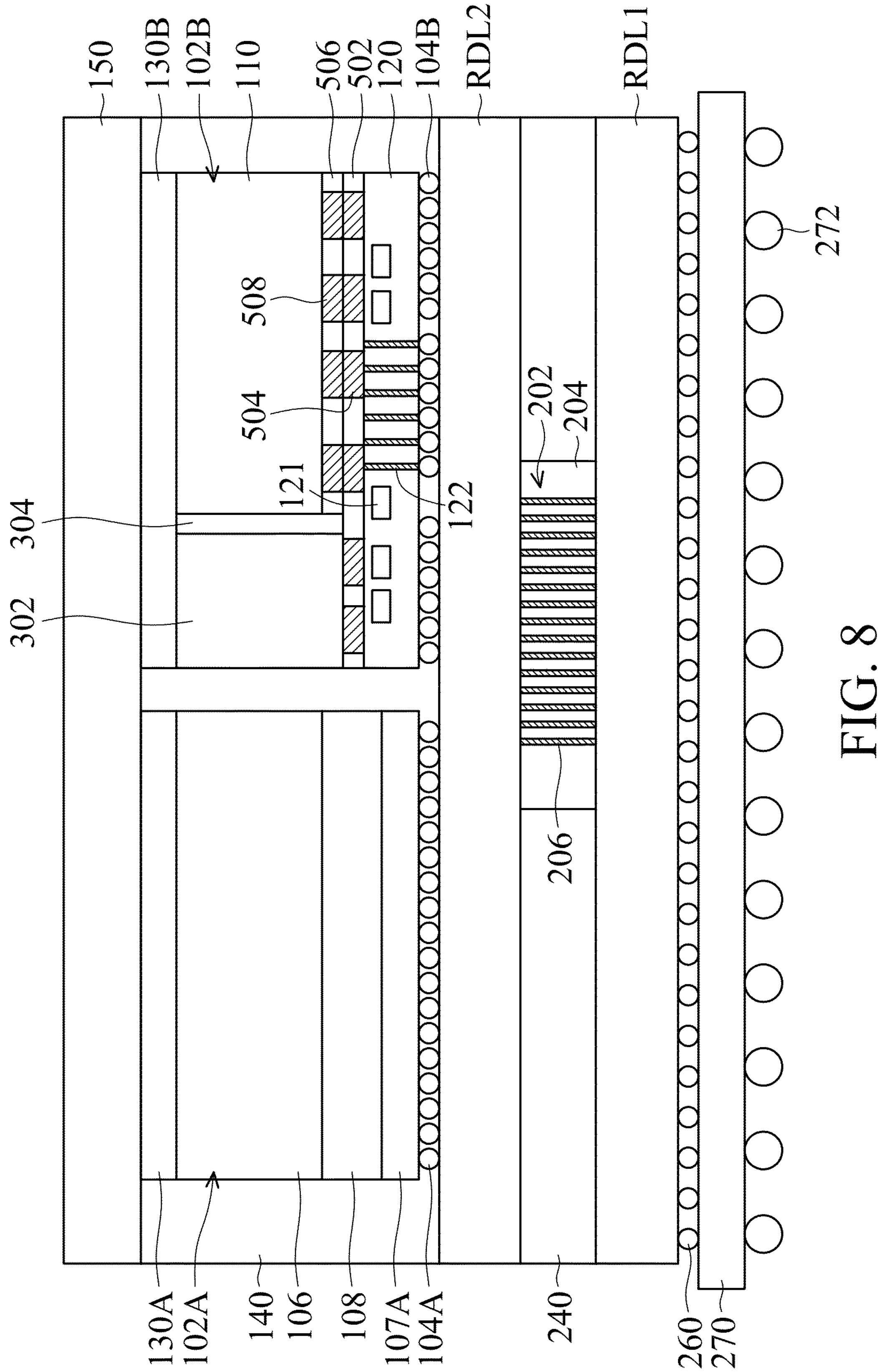
FIG. 8 is a cross-sectional view of a portion of a package structure, in accordance with some embodiments.

Many variations and/or modifications can be made to embodiments of the disclosure. FIG. 8 is a cross-sectional view of a portion of a package structure, in accordance with some embodiments. As shown in FIG. 8, a package structure that is similar to that shown in FIG. 3 is formed. In some embodiments, similar to the embodiments illustrated in FIG. 5, the chip structure 102B and the interposer chip 120 are directly bonded together through dielectric-to-dielectric bonding (e.g., the bond between the dielectric bonding structures 502 and 506) and metal-to-metal bonding (e.g., the bond between the metal bonding structures 504 and 508). In some embodiments, the dummy chip 302 is directly bonded to the dielectric bonding structure 502 and some of the metal bonding structures 504 of the interposer chip 120.

Figure 9:
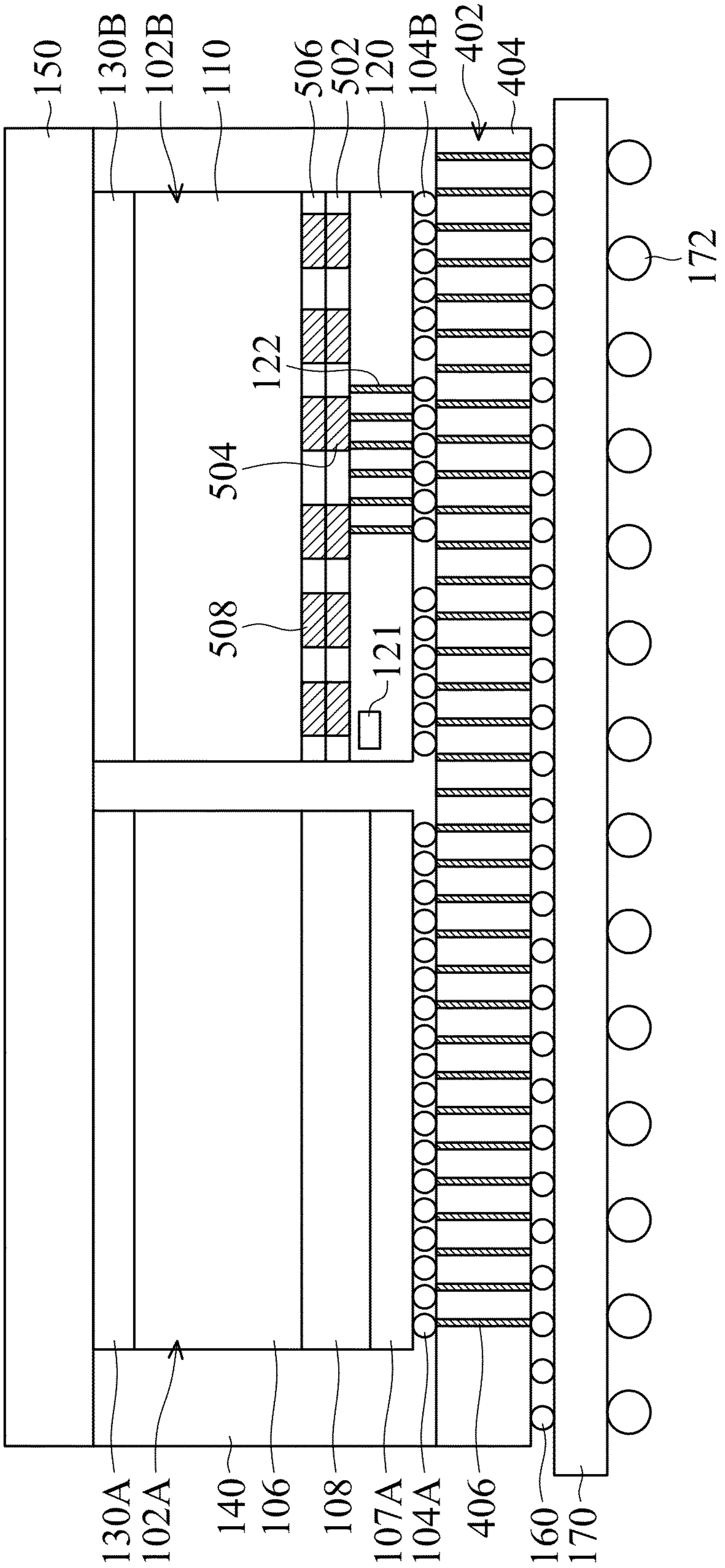
FIG. 9 is a cross-sectional view of a portion of a package structure, in accordance with some embodiments.

Many variations and/or modifications can be made to embodiments of the disclosure. FIG. 9 is a cross-sectional view of a portion of a package structure, in accordance with some embodiments. As shown in FIG. 9, a package structure that is similar to that shown in FIG. 4 is formed. In some embodiments, similar to the embodiments illustrated in FIG. 5, the chip structure 102B and the interposer chip 120 are directly bonded together through dielectric-to-dielectric bonding (e.g., the bond between the dielectric bonding structures 502 and 506) and metal-to-metal bonding (e.g., the bond between the metal bonding structures 504 and 508).

In some embodiments, there is one dummy chip 302 formed between the interposer chip 120 and the heat-spreading lid 150. However, embodiments of the disclosure are not limited thereto. Many variations and/or modifications can be made to embodiments of the disclosure. In some other embodiments, two or more dummy chips are disposed beside the chip structure 102B.

Figure 11:
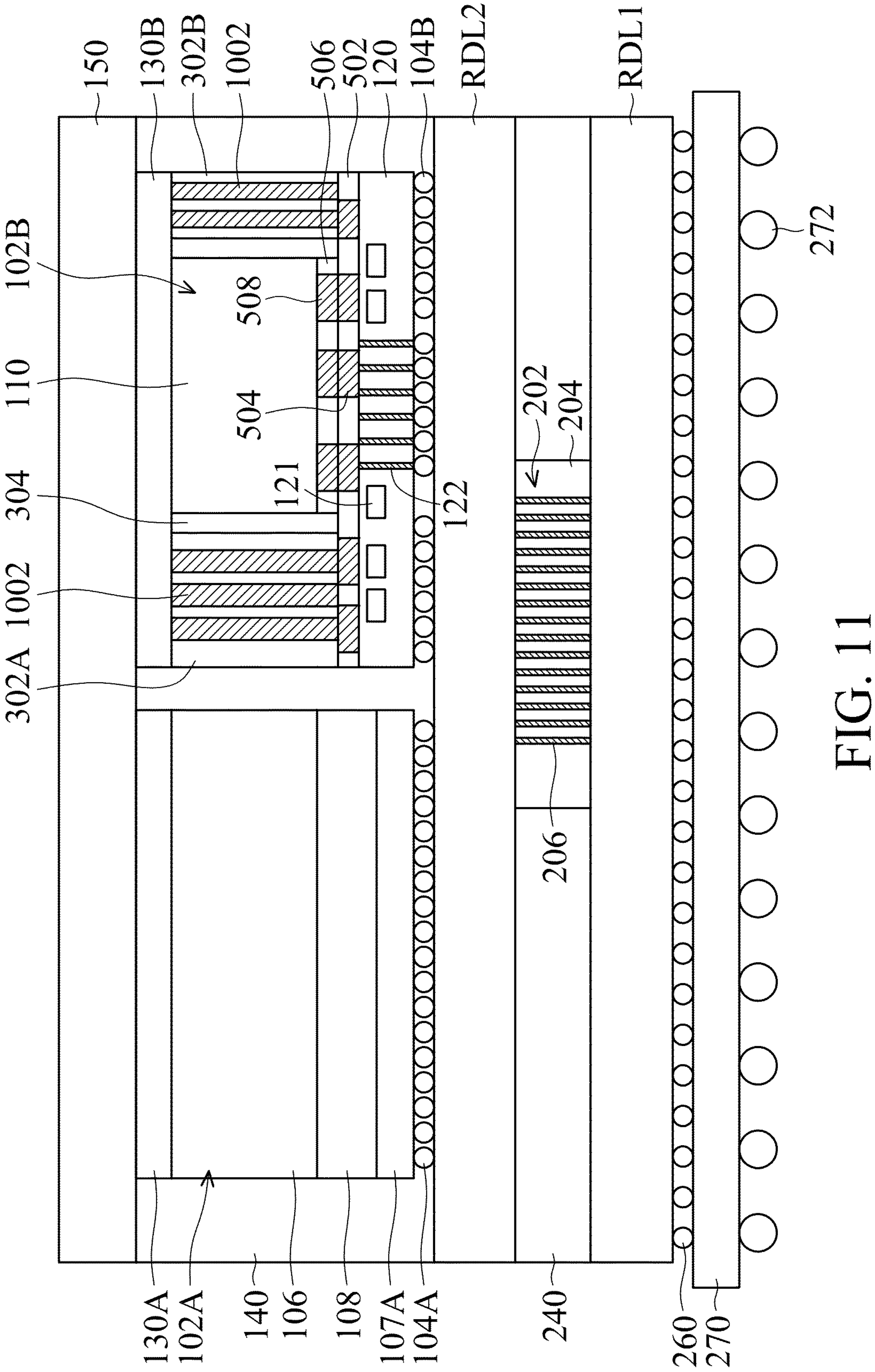
FIG. 11 is a cross-sectional view of a portion of a package structure, in accordance with some embodiments.

FIG. 11 is a cross-sectional view of a portion of a package structure, in accordance with some embodiments. In some embodiments, dummy chips 302A and 302B are formed beside the chip structure 102B. In some embodiments, similar to the embodiments illustrated in FIG. 10B, multiple thermal conductive vias 1002 are formed in the dummy chips 302A and 302B. The dummy chips 302A and 302B may further improve the heat dissipation of the package structure.

In some embodiments, the chip structure 102A and/or the chip structure 102B include semiconductor substrate portions. However, embodiments of the disclosure are not limited thereto. Many variations and/or modification can be made to embodiments of the disclosure. In some other embodiments, the chip structure 102A and/or the chip structure 102B are free of the semiconductor substrate portions.

Figure 12:
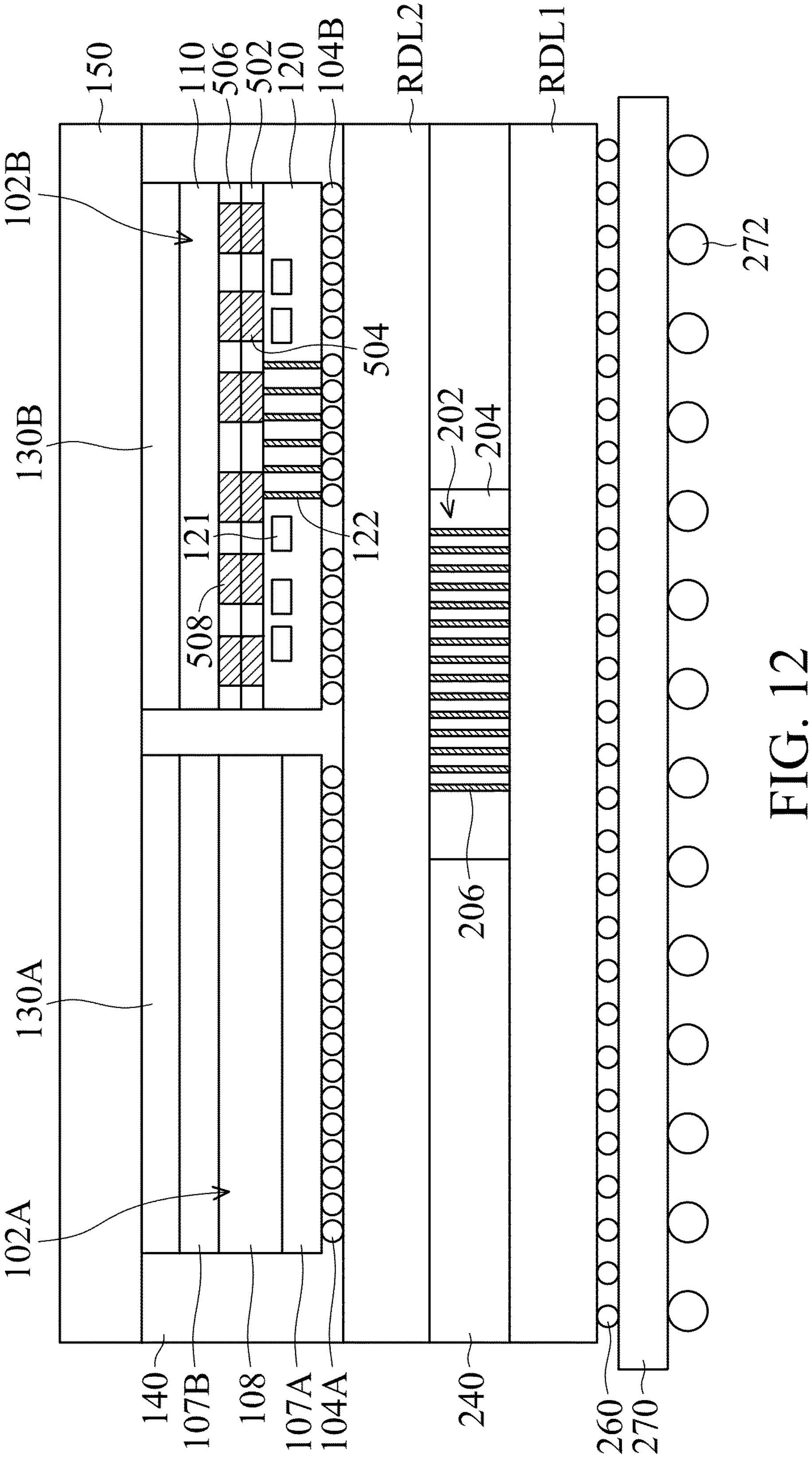
FIG. 12 is a cross-sectional view of a portion of a package structure, in accordance with some embodiments.

FIG. 12 is a cross-sectional view of a portion of a package structure, in accordance with some embodiments. As shown in FIG. 12, a package structure that is similar to that shown in FIG. 6 is formed. In some embodiments, the chip structure 102A includes interconnection structures 107A and 107B that are formed on the opposite surfaces of the device portion 108. The interconnection structures 107A and 107B may function as a frontside interconnection structure and a back-side interconnection structure, respectively. In some embodiments, the chip structure 102A does not include a semiconductor substrate portion. As a result, the heat dissipation of the device elements in the device portion 108 may become easier. The performance and reliability of the package structure are improved.

Embodiments of the disclosure form a package structure with a first chip-containing structure and an interposer chip carrying a second chip-containing structure. The first chip-containing structure and the interposer chip are bonded onto a redistribution structure that may be a polymer-containing redistribution structure or a semiconductor interposer. The interposer chip may include one or more active devices. The active devices may be used to provide electrical communication between some devices (such as logic devices) of the first chip-containing structure and some devices (such as memory devices) of the second chip-containing structure. Due to the assistance of the active devices formed in the interposer chip, a large amount of electrical signal is operated by the active devices of the interposer chip without being transmitted to the first chip-containing structure directly. The operation speed is thus greatly improved. The heat generated during operation is also significantly reduced, which leads to a low operation temperature. The performance and reliability of the package structure are thus greatly improved.

In accordance with some embodiments, a package structure is provided. The package structure includes a chip-containing structure bonded to a redistribution structure through multiple first solder bumps. The package structure also includes a memory-containing structure bonded to an interposer chip. The interposer chip is bonded to the redistribution structure through multiple second solder bumps. The package structure further includes a substrate, and the redistribution structure is over the substrate.

In accordance with some embodiments, a package structure is provided. The package structure includes a first chip-containing structure bonded to a redistribution structure and an interposer chip bonded to the redistribution structure. The interposer chip has an active device. The package structure also includes a second chip-containing structure bonded to the interposer chip. The active device of the interposer chip provides electrical communication between the first chip-containing structure and the second chip-containing structure.

In accordance with some embodiments, a method for forming a package structure is provided. The method includes forming a redistribution structure over a carrier substrate and bonding a first chip-containing structure to the redistribution structure. The method also includes bonding a second chip-containing structure to an interposer chip, and the interposer chip has an active device. The method further includes bonding the interposer chip to the redistribution structure. The active device of the interposer chip provides electrical communication between the first chip-containing structure and the second chip-containing structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a substrate;

a redistribution structure over the substrate;

a chip-containing structure bonded to the redistribution structure through a plurality of first solder bumps;

an interposer chip bonded to the redistribution structure through a plurality of second solder bumps;

a memory-containing structure bonded to the interposer chip;

a heat-spreading lid extending across opposite sidewalls of the chip-containing structure and opposite sidewalls of the memory-containing structure;

a first thermal conductive layer between the heat-spreading lid and the chip-containing structure; and a second thermal conductive layer between the heat-spreading lid and the memory-containing structure.

2. The package structure of claim 1, wherein the interposer chip comprises an active device.

3. The package structure of claim 2, wherein the active device provides electrical communication between the chip-containing structure and the memory-containing structure.

4. The package structure of claim 1, wherein the interposer chip comprises a plurality of through-substrate vias.

5. The package structure of claim 1, wherein the redistribution structure comprises a plurality of conductive features surrounded by a plurality of polymer-containing insulating layers.

6. The package structure of claim 1, further comprising:
a molding layer between the heat-spreading lid and the redistribution structure, wherein the molding layer laterally surrounds the chip-containing structure, the memory-containing structure, and the interposer chip.

7. The package structure of claim 1, wherein:
the memory-containing structure has a plurality of first metal bonding structures and a first dielectric bonding structure laterally surrounding the first metal bonding structures,
surfaces of the first metal bonding structures and a surface of the first dielectric bonding structure are substantially coplanar,
the interposer chip has a plurality of second metal bonding structures and a second dielectric bonding structure laterally surrounding the second metal bonding structures,
surfaces of the second metal bonding structures and a surface of the second dielectric bonding structure are substantially coplanar,
the first metal bonding structures and the second metal bonding structures are in direct contact with each other, and
the first dielectric bonding structure and the second dielectric bonding structure are in direct contact with each other.

8. The package structure of claim 1, further comprising:
a dummy chip over the interposer chip, wherein the dummy chip is free of active devices, and a top of the dummy chip is substantially level with a top of the memory-containing structure.

9. The package structure of claim 8, further comprising:
a plurality of thermal conductive vias within the dummy chip.

10. A package structure, comprising:
a first chip-containing structure bonded to a redistribution structure;
an interposer chip bonded to the redistribution structure, wherein the interposer chip has an active device; and
a second chip-containing structure bonded to the interposer chip;
wherein the second chip-containing structure has a plurality of first metal bonding structures and a first dielectric bonding structure laterally surrounding the first metal bonding structures,
surfaces of the first metal bonding structures and a surface of the first dielectric bonding structure are substantially coplanar,
the interposer chip has a plurality of second metal bonding structures and a second dielectric bonding structure laterally surrounding the second metal bonding structures,
surfaces of the second metal bonding structures and a surface of the second dielectric bonding structure are substantially coplanar,
the first metal bonding structures and the second metal bonding structures are directly bonded together, and
the first dielectric bonding structure and the second dielectric bonding structure are directly bonded together.

11. The package structure of claim 10, wherein the interposer chip is wider than the second chip-containing structure.

12. The package structure of claim 10, further comprising:
a heat-spreading lid extending across opposite sidewalls of the first chip-containing structure, opposite sidewalls of the second chip-containing structure, and opposite sidewalls of the interposer chip; and
a protective layer between the heat-spreading lid and the redistribution structure, wherein the protective layer laterally surrounds the first chip-containing structure, the second chip-containing structure, and the interposer chip.

13. The package structure of claim 10, further comprising:
a second redistribution structure below the redistribution structure;
a local interconnection chip between the redistribution structure and the second redistribution structure, wherein the local interconnection chip extends across a gap between the first chip-containing structure and the interposer chip; and
a molding layer between the redistribution structure and the second redistribution structure, wherein the molding layer laterally surrounds the local interconnection chip.

14. A method for forming a package structure, comprising:
forming a redistribution structure over a carrier substrate;
bonding a first chip-containing structure to the redistribution structure;
bonding a second chip-containing structure to an interposer chip, wherein the interposer chip has an active device; and
bonding the interposer chip to the redistribution structure;
wherein the second chip-containing structure has a plurality of first metal bonding structures and a first dielectric bonding structure laterally surrounding the first metal bonding structures,
surfaces of the first metal bonding structures and a surface of the first dielectric bonding structure are substantially coplanar,
the interposer chip has a plurality of second metal bonding structures and a second dielectric bonding structure laterally surrounding the second metal bonding structures,
surfaces of the second metal bonding structures and a surface of the second dielectric bonding structure are substantially coplanar,
the first metal bonding structures and the second metal bonding structures are directly bonded together, and
the first dielectric bonding structure and the second dielectric bonding structure are directly bonded together.

15. The method for forming a package structure as claimed in claim 14, further comprising:
disposing a heat-spreading lid over the first chip-containing structure and the second chip-containing structure.

16. The method of claim 14, further comprising:
removing the carrier substrate; and
bonding the redistribution structure to a substrate through a plurality of tin-containing solder bumps.

17. The method of claim 14, further comprising:
forming a lower redistribution structure over the carrier substrate before the redistribution structure is formed;

disposing a local interconnection chip over the lower redistribution structure;

forming a molding layer over the lower redistribution structure to laterally surround the local interconnection chip; and forming the redistribution structure over the molding layer and the local interconnection chip.

* * * * *